(12) United States Patent
Yadala et al.

(10) Patent No.: US 11,043,276 B1
(45) Date of Patent: Jun. 22, 2021

(54) SENSE AMPLIFIER ARCHITECTURE PROVIDING IMPROVED MEMORY PERFORMANCE

(71) Applicant: SanDisk Technologies LLC, Addison, TX (US)

(72) Inventors: Sridhar Yadala, Bangalore (IN); Kishan Santoki, Bangalore (IN); Rangarao Samineni, Bangalore (IN)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/796,270

(22) Filed: Feb. 20, 2020

(51) Int. Cl.
| | |
|---|---|
| *G11C 19/06* | (2006.01) |
| *G11C 16/26* | (2006.01) |
| *G11C 16/04* | (2006.01) |
| *G11C 16/24* | (2006.01) |
| *G11C 11/56* | (2006.01) |

(52) U.S. Cl.
CPC .......... *G11C 16/26* (2013.01); *G11C 16/0483* (2013.01); *G11C 16/24* (2013.01); *G11C 11/5642* (2013.01); *G11C 11/5671* (2013.01)

(58) Field of Classification Search
CPC ...................................................... G11C 16/26
USPC ...................................................... 365/185.21
See application file for complete search history.

(56) References Cited

U.S. PATENT DOCUMENTS

| | | | |
|---|---|---|---|
| 6,297,624 | B1 | 10/2001 | Mitsui et al. |
| 6,333,885 | B1 | 12/2001 | Bedarida et al. |
| 6,404,677 | B2 | 6/2002 | Lee |
| 6,424,554 | B1 | 7/2002 | Kawasumi |
| 6,885,600 | B2 | 4/2005 | Tran et al. |
| 7,009,880 | B1 | 3/2006 | Liu |
| 7,158,432 | B1 | 1/2007 | Hunter et al. |
| 9,939,831 | B2 | 4/2018 | Verma et al. |
| 2019/0096480 | A1* | 3/2019 | Conte ................ G11C 13/0028 |

\* cited by examiner

*Primary Examiner* — Hoai V Ho
(74) *Attorney, Agent, or Firm* — Vierra Magen Marcus LLP

(57) ABSTRACT

A sense amplifier for a memory circuit is presented that can reduce sensing times by introduction of a local reference generator. The sense amplifier includes two capacitors that are pre-charged prior to a sensing operation. A first of the capacitors is connected so that it can discharge through a selected memory cell at a rate dependent on the conductivity of the selected memory cell. After a sensing interval in which the first capacitor can discharge through the selected memory cell, the voltage level on the first capacitor is compared with the voltage level on the second capacitor to determine the result of the sensing operation.

20 Claims, 23 Drawing Sheets

SENSE AMPLIFIER ARCHITECTURE PROVIDING IMPROVED MEMORY PERFORMANCE

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery).

BRIEF DESCRIPTION OF THE DRAWINGS

Like-numbered elements refer to common components in the different figures.

DETAILED DESCRIPTION

An important factor in the performance of a memory circuit is the speed with which memory cells can be sensed. Sensing operations are used both in data read operations and also in verify operations for writing data and erasing data. Consequently, any improvements in sensing times can significantly improve memory performance, particularly in multi-state memory devices where determining the data state of a memory cell can involve multiple sensing operations.

To improve memory performance, a sense amplifier architecture is presented that can reduce sensing times by introduction of a local reference generator. The sense amplifier includes two capacitors that are pre-charged prior to a sensing operation. A first of the capacitors is connected so that it can discharge through a selected memory cell at a rate dependent on the conductivity of the selected memory cell. At the end of a sensing interval in which the first capacitor can discharge through the selected memory cell, the voltage level on the first capacitor reflects the memory cell's data state. The voltage level on the second capacitor provides the local reference value. The voltage level on the first capacitor is compared with the voltage level on the second capacitor to determine the result of the sensing operation.

Figure 1A:
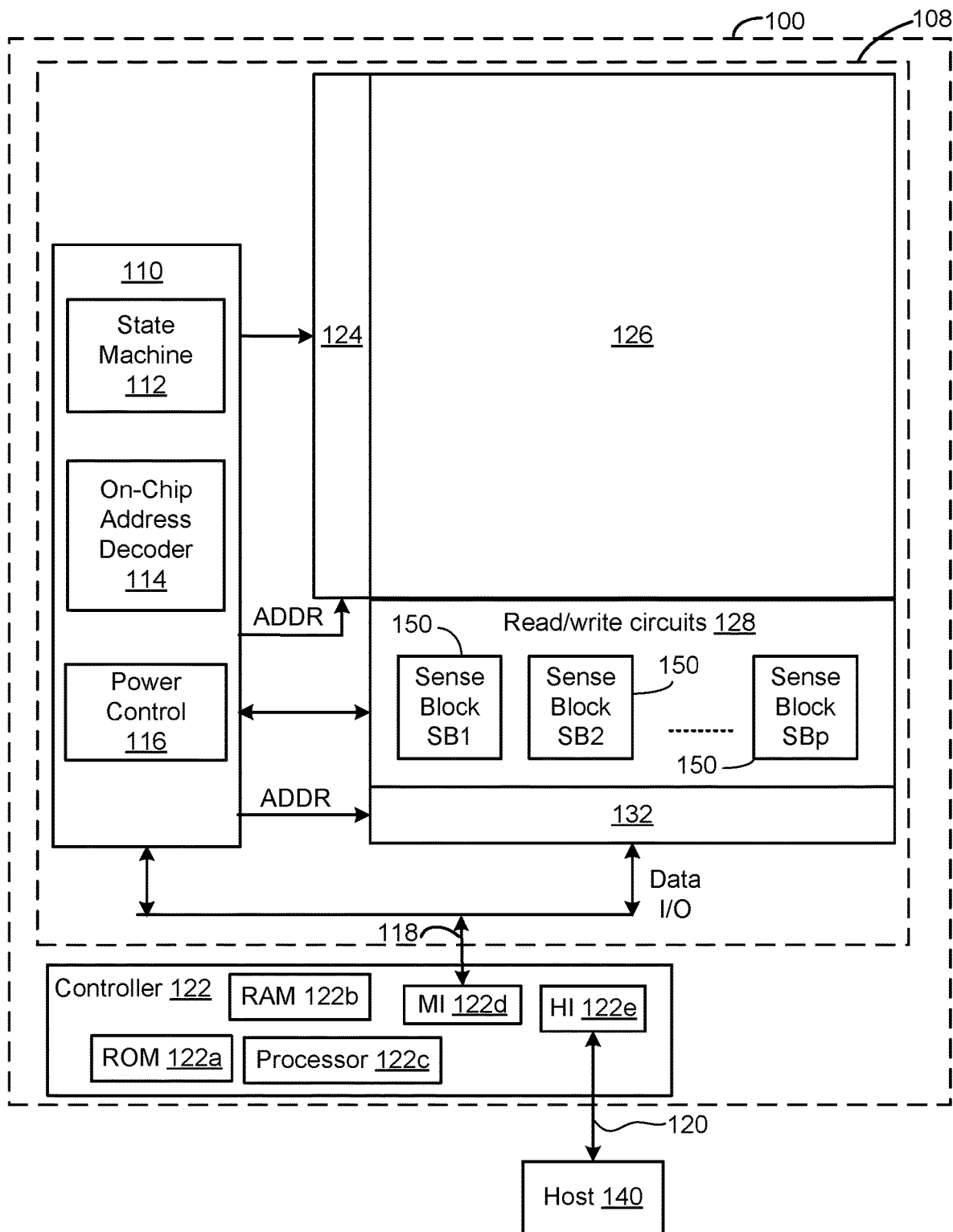
FIG. 1A is a functional block diagram of a memory device.

FIGS. 1A-5 describe examples of memory systems that can be used to implement the technology proposed herein. FIG. 1A is a functional block diagram of an example memory system 100. In one embodiment, the components depicted in FIG. 1A are electrical circuits. Memory system 100 includes one or more memory dies 108. The one or more memory dies 108 can be complete memory dies or partial memory dies. In one embodiment, each memory die 108 includes a memory structure 126, control circuitry 110, and read/write circuits 128. Memory structure 126 is addressable by word lines via a row decoder 124 and by bit lines via a column decoder 132. The row decoder 124 can include the drivers and other elements to bias the word lines for the different memory operations. The read/write circuits 128 include multiple sense blocks 150 including SB1, SB2, . . . , SBp (sensing circuitry) and allow a page of memory cells to be read or programmed in parallel, where a page is the unit in which data is written and/or read. A physical page is the physical unit of a number of cells into which data can be concurrently written and/or read, and a logical page a corresponding logical unit of data written into a physical page. More detail on sense amplifier circuits that can be used in the sense blocks 150 including SB1, SB2, . . . , SBp is given below.

In some systems, a controller 122 is included in the same package (e.g., a removable storage card) as the one or more memory die 108. However, in other systems, the controller can be separated from the memory die 108. In some embodiments the controller will be on a different die than the memory die 108. In some embodiments, one controller 122 will communicate with multiple memory die 108. In other embodiments, each memory die 108 has its own controller. Commands and data are transferred between a host 140 and controller 122 via a data bus 120, and between controller 122 and the one or more memory die 108 via lines 118. In one embodiment, memory die 108 includes a set of input and/or output (I/O) pins that connect to lines 118.

Control circuitry 110 cooperates with the read/write circuits 128 to perform memory operations (e.g., write, read, and others) on memory structure 126, and includes a state machine 112, an on-chip address decoder 114, and a power control circuit 116. The state machine 112 provides die-level control of memory operations. In one embodiment, state machine 112 is programmable by software. In other embodiments, state machine 112 does not use software and is completely implemented in hardware (e.g., electrical circuits). In other embodiments, state machine 112 can be replaced by a programmable microcontroller. Control circuitry 110 also includes buffers such as registers, ROM fuses and other storage devices for storing default values such as base voltages and other parameters.

The on-chip address decoder 114 provides an address interface between addresses used by host 140 or controller 122 to the hardware address used by the decoders 124 and 132. Power control module 116 controls the power and voltages supplied to the word lines and bit lines during memory operations. Power control module 116 may include charge pumps for creating voltages. The sense blocks include bit line drivers.

Figure 2:
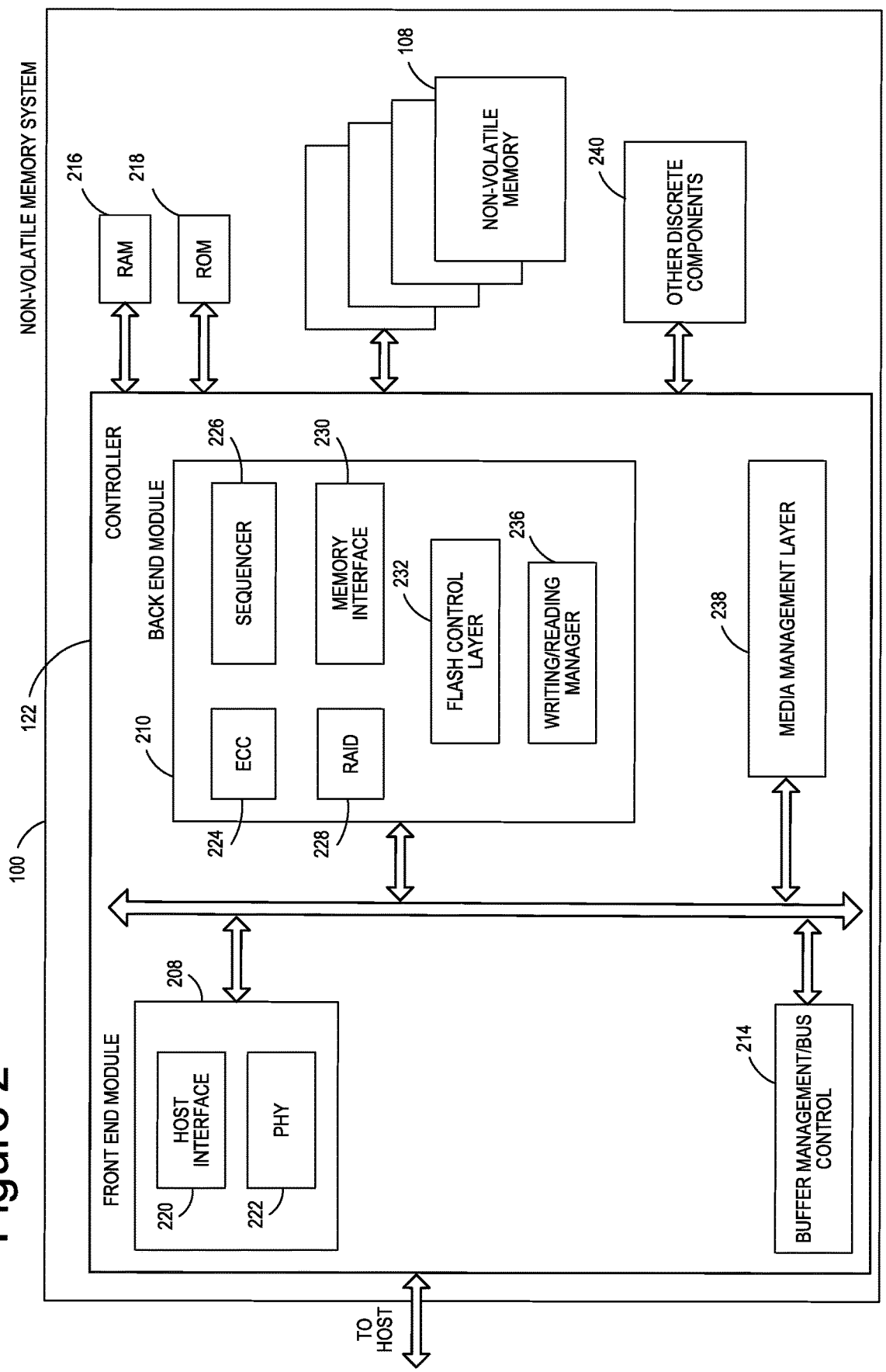
FIG. 2 is a block diagram depicting one embodiment of a memory system.

State machine 112 and/or controller 122 (or equivalently functioned circuits), in combination with all or a subset of the other circuits depicted in FIG. 2, can be considered part of the control circuits that perform the functions described herein. The control circuits can include hardware only or a combination of hardware and software (including firmware). For example, a controller programmed by firmware to perform the functions described herein is one example of a control circuit. A control circuit can include a processor, FGA, ASIC, integrated circuit or other type of circuit.

The (on-chip or off-chip) controller 122 (which in one embodiment is an electrical circuit) may comprise one or more processors 122c, ROM 122a, RAM 122b, a memory interface (MI) 122d and a host interface (HI) 122e, all of which are interconnected. The storage devices (ROM 122a, RAM 122b) store code (software) such as a set of instructions (including firmware), and one or more processors 122c is/are operable to execute the set of instructions to provide the functionality described herein. Alternatively, or additionally, one or more processors 122c can access code from a storage device in the memory structure, such as a reserved area of memory cells connected to one or more word lines. RAM 122b can be to store data for controller 122, including caching program data. Memory interface 122d, in communication with ROM 122a, RAM 122b and processor 122c, is an electrical circuit that provides an electrical interface between controller 122 and one or more memory die 108. For example, memory interface 122d can change the format or timing of signals, provide a buffer, isolate from surges, latch I/O, etc. One or more processors 122c can issue commands to control circuitry 110 (or another component of memory die 108) via Memory Interface 122d. Host interface 122e provides an electrical interface with host 140 data bus 120 in order to receive commands, addresses and/or data from host 140 to provide data and/or status to host 140.

In one embodiment, memory structure 126 comprises a three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 126 comprises a two-dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 126 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other embodiments, the memory cells of a PCM memory can have their data state set or reset through use of current pulses. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 1B:
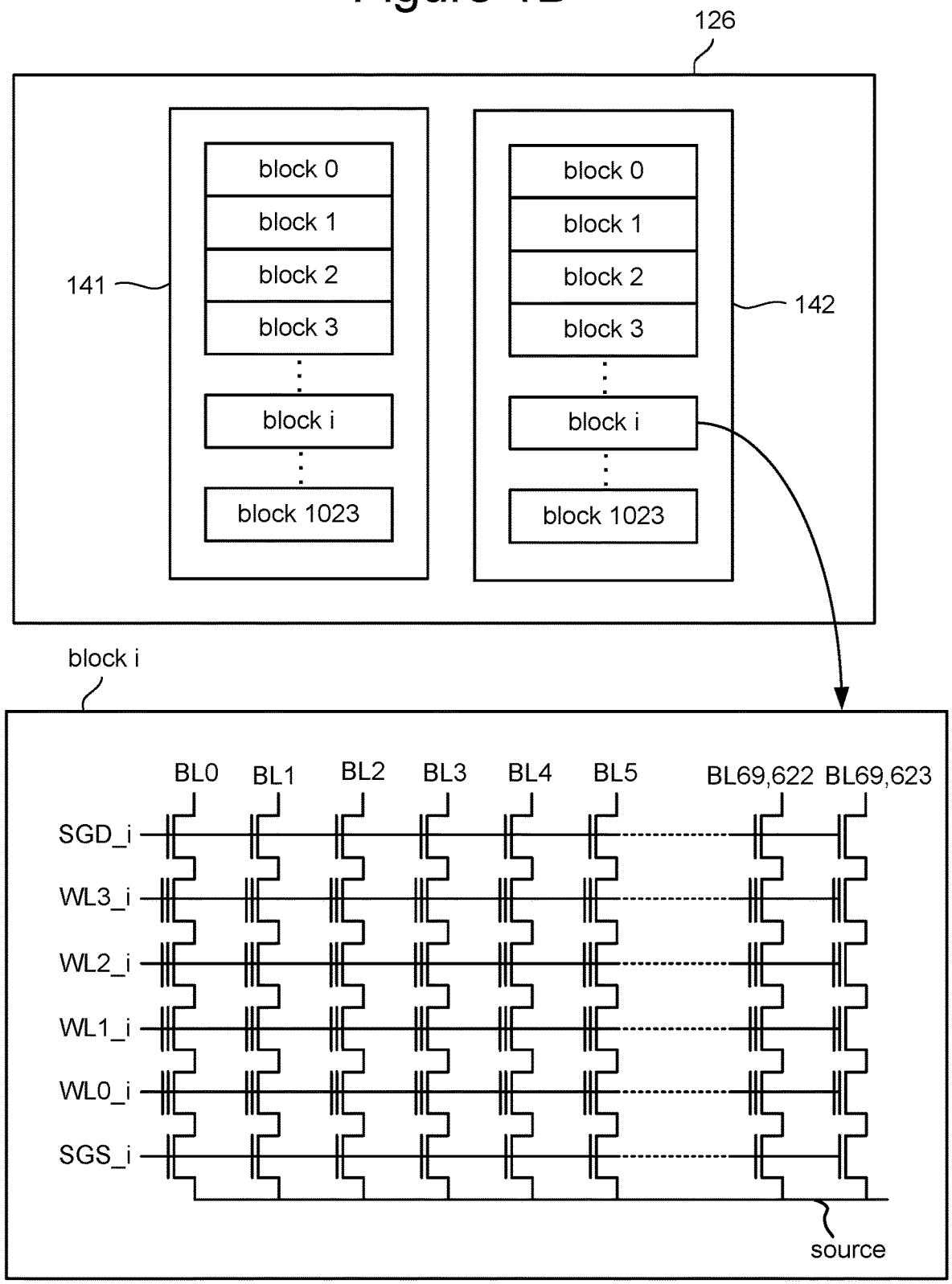
FIG. 1B is a block diagram depicting one example of a memory structure.

FIG. 1B depicts an example of memory structure 126. In one embodiment, an array of memory cells is divided into multiple planes. In the example of FIG. 1B, memory structure 126 is divided into two planes: plane 141 and plane 142. In other embodiments, more or less than two planes can be used. In some embodiments, each plane is divided into a number of memory erase blocks (e.g., blocks 0-1023, or another amount). In certain memory technologies (e.g. 2D/3D NAND and other types of flash memory), a memory erase block is the smallest unit of memory cells for an erase operation. That is, each erase block contains the minimum number of memory cells that are erased together in a single erase operation. Other units of erase can also be used. In other memory technologies (e.g. MRAM, PCM, etc.) used in other embodiments implementing the solution claimed herein, memory cells may be overwritten without an erase operation and so erase blocks may not exist.

Each memory erase block includes many memory cells. The design, size, and organization of a memory erase block depends on the architecture and design for the memory structure 126. As used herein, a memory erase block is a contiguous set of memory cells that share word lines and bit lines; for example, erase block i of FIG. 1B includes memory cells that share word lines WL0_$i$, WL1_$i$, WL2_$i$ and WL3_$i$ and share bit lines BL0-BL69,623.

In one embodiment, a memory erase block (see block i) contains a set of NAND strings which are accessed via bit lines (e.g., bit lines BL0-BL69,623) and word lines (WL0, WL1, WL2, WL3). FIG. 1B shows four memory cells connected in series to form a NAND string. Although four cells are depicted to be included in each NAND string, more or less than four can be used (e.g., 16, 32, 64, 128, 256 or another number or memory cells can be on a NAND string). One terminal of the NAND string is connected to a corresponding bit line via a drain select gate, and another terminal is connected to the source line via a source select gate. Although FIG. 1B shows 69,624 bit lines, a different number of bit lines can also be used.

Each memory erase block and/or each memory storage unit is typically divided into a number of pages. In one embodiment, a page is a unit of programming/writing and a unit of reading. Other units of programming can also be used. One or more pages of data are typically stored in one row of memory cells. For example, one or more pages of data may be stored in memory cells connected to a common word line. A page includes user data and overhead data (also called system data). Overhead data typically includes header information and Error Correction Codes (ECC) that have been calculated from the user data of the sector. The controller (or other component) calculates the ECC when data is being written into the array, and also checks it when data is being read from the array. In one embodiment, a page includes data stored in all memory cells connected to a common word line.

In the example discussed above, the unit of erase is a memory erase block and the unit of programming and reading is a page. Other units of operation can also be used. Data can be stored/written/programmed, read or erased a byte at a time, 1K bytes, 512K bytes, etc. No particular unit of operation is required for the claimed solutions described herein. In some examples, the system programs, erases, and reads at the same unit of operation. In other embodiments, the system programs, erases, and reads at different units of operation. In some examples, the system programs/writes and erases, while in other examples the system only needs to program/write, without the need to erase, because the system can program/write zeros and ones (or other data values) and can thus overwrite previously stored information.

As used herein, a memory storage unit is the set of memory cells representing the smallest storage unit of operation for the memory technology to store/write/program data into the memory structure 126. For example, in one embodiment, the memory storage unit is a page sized to hold 4 KB of data. In certain embodiments, a complete memory storage unit is sized to match the number of physical memory cells across a row of the memory structure 126. In one embodiment, an incomplete memory storage unit has fewer physical memory cells than a complete memory storage unit.

FIG. 2 is a block diagram of example memory system 100, depicting more details of one embodiment of controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card-based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid-state drive (SSD).

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 2, controller 122 includes a front-end module 208 that interfaces with a host, a back-end module 210 that interfaces with the one or more non-volatile memory die 108, and various other modules that perform functions which will now be described in detail.

The components of controller 122 depicted in FIG. 2 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include software stored in a processor readable device (e.g., memory) to program a processor for controller 122 to perform the functions described herein. The architecture depicted in FIG. 2 is one example implementation that may (or may not) use the components of controller 122 depicted in FIG. 1A (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 2 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A Redundant Array of Independent Dies (RAID) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

One embodiment includes a writing/reading manager 236, which can be used to manage (in conjunction with the circuits on the memory die) the writing and reading of memory cells. In some embodiments, writing/reading manager 236 performs the processes depicted in the flowcharts described below.

Additional components of system 100 illustrated in FIG. 2 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory structure 126 of die 108. The MML 238 may be needed because: 1) the memory may have limited endurance; 2) the memory structure 126 may only be written in multiples of pages; and/or 3) the memory structure 126 may not be written unless it is erased as a block. The MML 238 understands these potential limitations of the memory structure 126 which may not be visible to the host. Accordingly, the MML 238 attempts to translate the writes from host into writes into the memory structure 126. Erratic bits may be identified and recorded using the MML 238. This recording of erratic bits can be used for evaluating the health of blocks and/or word lines (the memory cells on the word lines).

Controller 122 may interface with one or more memory dies 108. In one embodiment, controller 122 and multiple memory dies (together comprising non-volatile storage system 100) implement a solid-state drive (SSD), which can emulate, replace or be used instead of a hard disk drive inside a host, as a NAS device, in a laptop, in a tablet, in a server, etc. Additionally, the SSD need not be made to work as a hard drive.

Some embodiments of a non-volatile storage system will include one memory die 108 connected to one controller 122. However, other embodiments may include multiple memory die 108 in communication with one or more controllers 122. In one example, the multiple memory die can be grouped into a set of memory packages. Each memory package includes one or more memory die in communication with controller 122. In one embodiment, a memory package includes a printed circuit board (or similar structure) with one or more memory die mounted thereon. In some embodiments, a memory package can include molding material to encase the memory dies of the memory package. In some embodiments, controller 122 is physically separate from any of the memory packages.

Figure 3:
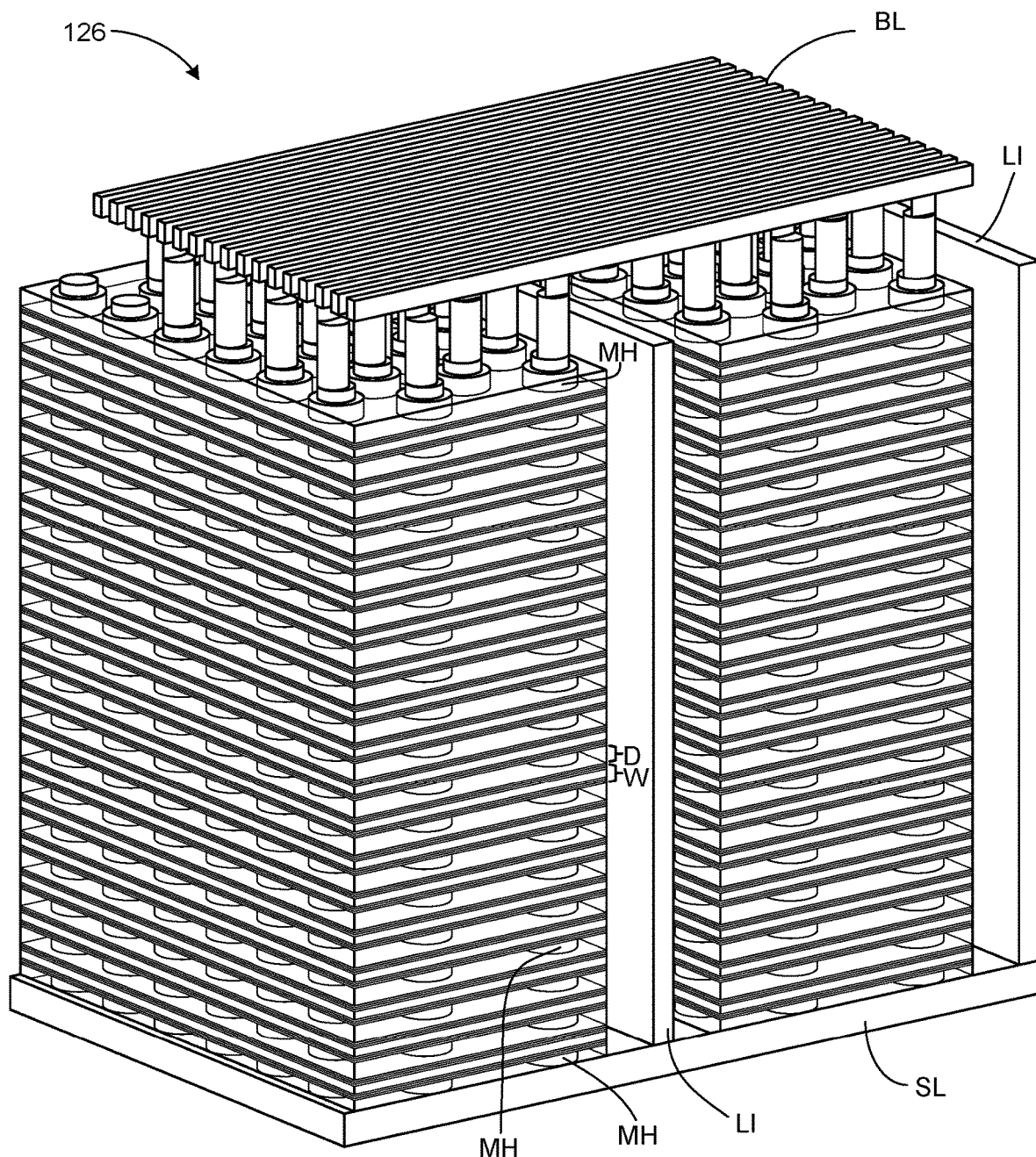
FIG. 3 is a perspective view of a portion of one embodiment of a monolithic three-dimensional memory structure.

FIG. 3 is a perspective view of a portion of one example embodiment of a monolithic three-dimensional memory structure 126, which includes a plurality memory cells. For example, FIG. 3 shows a portion of one block of memory. The structure depicted includes a set of bit lines BL positioned above a stack of alternating dielectric layers and conductive layers. For examplary purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI (isolation areas). FIG. 3 only shows two fingers and two local interconnects LI. Below the alternating dielectric layers and word line layers is a source line layer SL. Memory holes are formed in the stack of alternating dielectric layers and conductive layers. For example, one of the memory holes is marked as MK Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three-dimensional monolithic memory structure 126 is provided with respect to FIG. 4.

Figure 4:
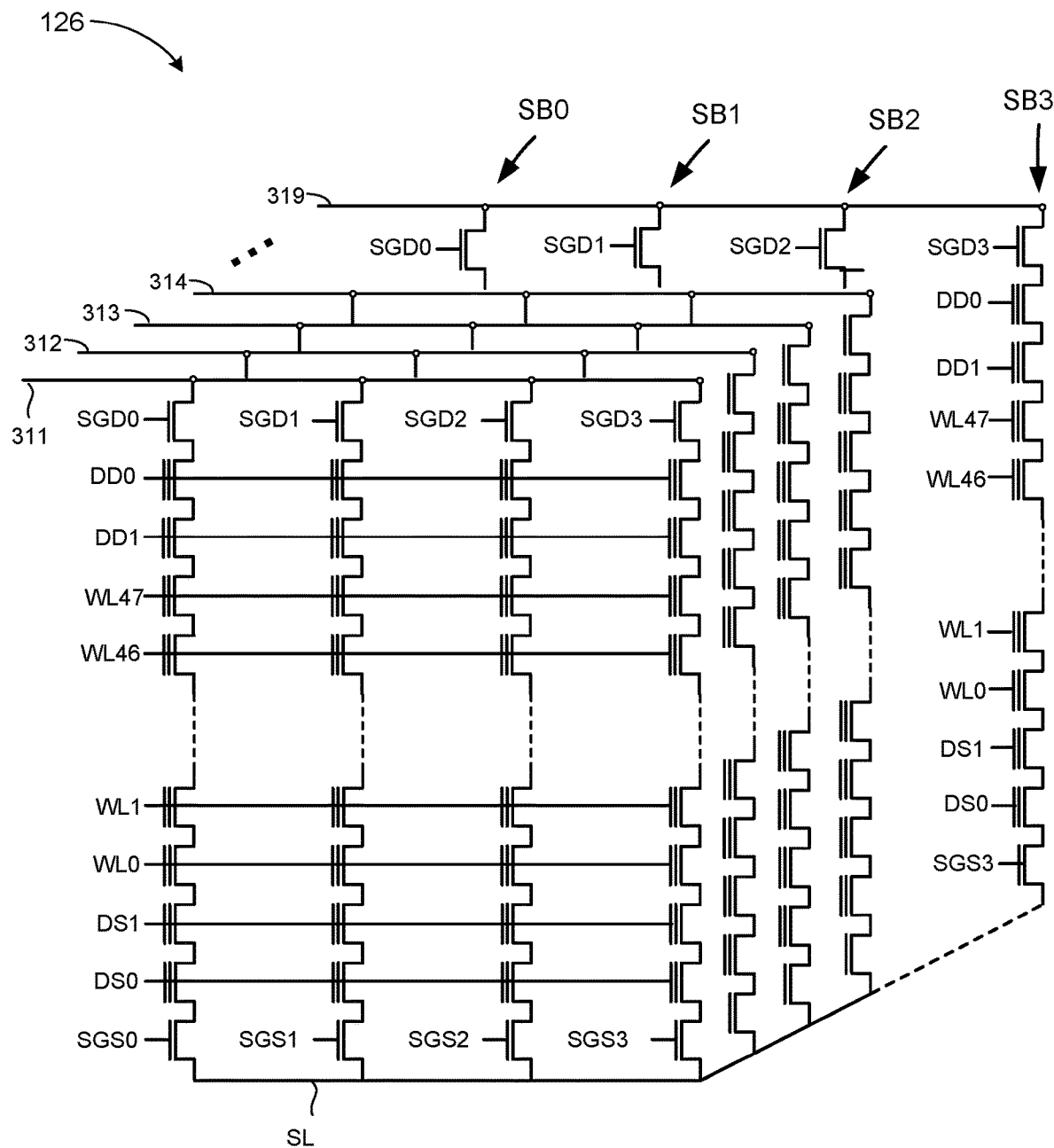
FIG. 4 is a schematic of a plurality of NAND strings.

FIG. 4 depicts an example 3D NAND structure and shows physical word lines WLL0-WLL47 running across the entire block. The structure of FIG. 4 can correspond to a portion of one of the blocks of FIG. 1B, including bit lines 311, 312, 313, 314, . . . , 319. Within the block, each bit line is connected to four NAND strings. Drain side selection lines SGD0, SGD1, SGD2 and SGD3 are used to determine which of the four NAND strings connect to the associated bit line. The block can also be thought of as being divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Figure 5:
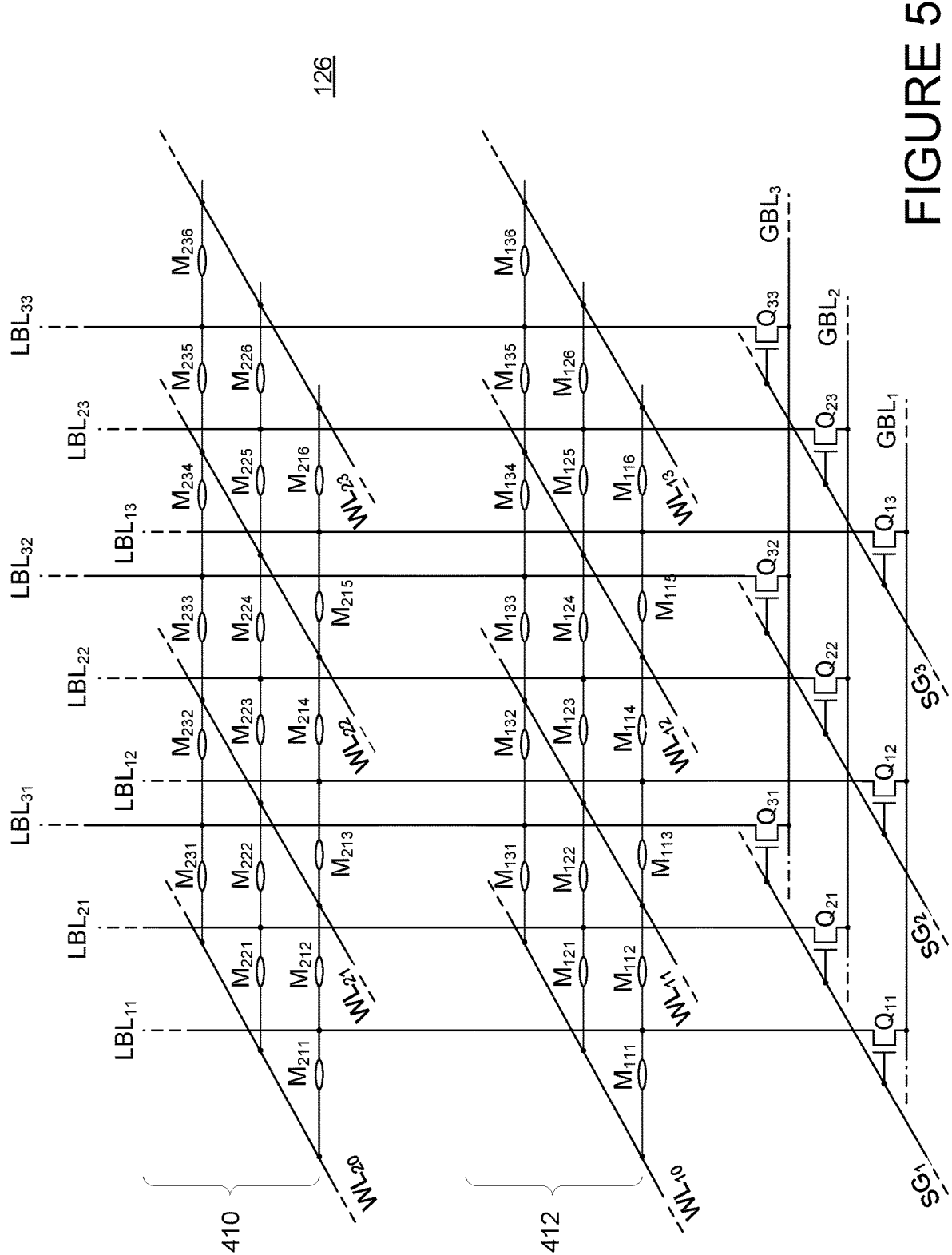
FIG. 5 depicts various embodiments of a portion of a three-dimensional memory array with a vertical cross-point structure.

FIG. 5 illustrates another memory structure that can be used for the structure 126 of FIG. 1A. FIG. 5 illustrates a three-dimensional vertical cross-point structure, the word lines still run horizontally, with the bit lines oriented to run in a vertical direction.

FIG. 5 depicts one embodiment of a portion of a monolithic three-dimensional memory array structure 126 that includes a first memory level 412 positioned below a second memory level 410. As depicted, the local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). This structure can be used with a number of different memory cell structures. In one example, the particular memory cell may include a floating gate device or a charge trap device (e.g., using a silicon nitride material). In another example, the particular memory cell may include a reversible resistance-switching material, a metal oxide, a phase change memory (PCM) material, or a ReRAM material. The global bit lines $GBL_1$-$GBL_3$ are arranged in a third direction that is perpendicular to both the first direction and the second direction. A set of bit line select devices (e.g., $Q_{11}$-$Q_{31}$), such as a vertical thin film transistor (VTFT), may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 5, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

Figure 6:
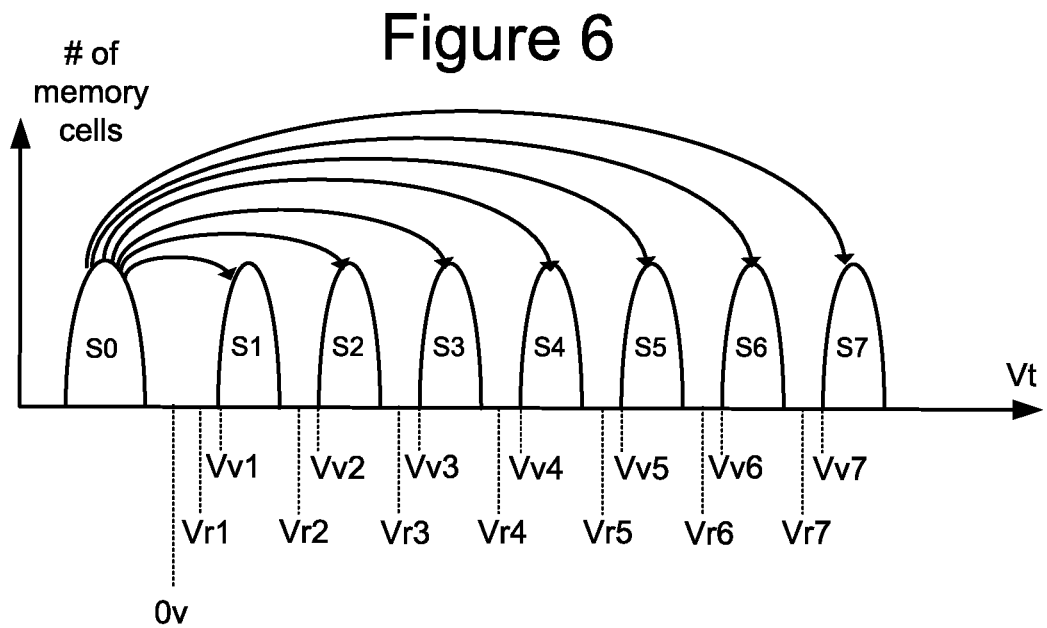
FIG. 6 depicts threshold voltage distributions in a three-bit per cell embodiment.

The memory systems discussed above can be erased, programmed/written and read. At the end of a successful programming process, the threshold voltages of the memory cells should be within one or more distributions of threshold voltages for programmed memory cells or within a distribution of threshold voltages (Vts) for erased memory cells, as appropriate. FIG. 6 illustrates example threshold voltage distributions for the memory cell array when each memory cell stores more than one bit of data in a multi-level cell (MLC) format, in this case three bits of data. Other embodiments, however, may use other data capacities per memory cell (e.g., such as one, two, four, or five bits of data per memory cell). FIG. 6 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 6 also shows seven read reference voltages, Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 6 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 6 represent the full sequence programming. The technology described herein can also be used with other types of programming in addition to full sequence programming (including, but not limited to, multiple stage/phase programming). In some embodiments, data states S1-S7 can overlap, with controller 122 relying on ECC to identify the correct data being stored.

Figure 7A:
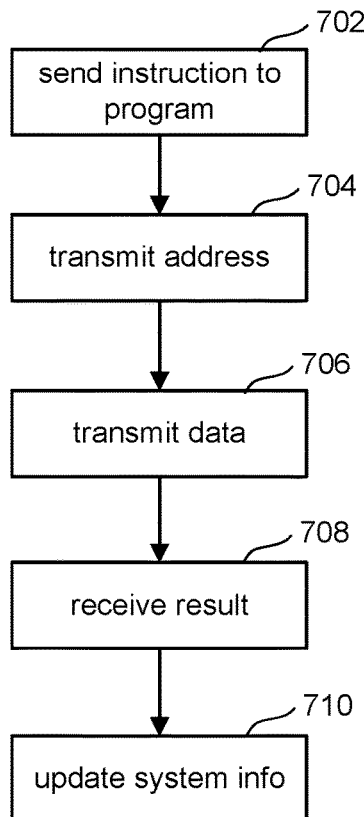
FIG. 7A is a flowchart describing one embodiment of a process for programming/writing.

FIG. 7A is a flowchart describing one embodiment of a process for programming that is performed by controller 122. In some embodiments, rather than have a dedicated controller, the host can perform the functions of the controller. In step 702, controller 122 sends instructions to one or more memory die 108 to program data. In step 704, controller 122 sends one or more addresses to one or more memory die 108. The one or more logical addresses indicate where to program the data. In step 706, controller 122 sends the data to be programmed to the one or more memory die 108. In step 708, controller 122 receives a result of the programming from the one or more memory die 108. Example results include that the data was programmed successfully, an indication that the programming operation failed, and indication that the data was programmed but at a different location, or other result. In step 710, in response to the result received in step 708, controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 702, controller 122 would receive host data and an instruction to program from the host, and the controller would run the ECC engine 224 to create code words from the host data, as known in the art. These code words are the data transmitted in step 706. Controller 122 (e.g., writing/reading manager 236) can also scramble the data prior to programming the data in the memory.

Figure 7B:
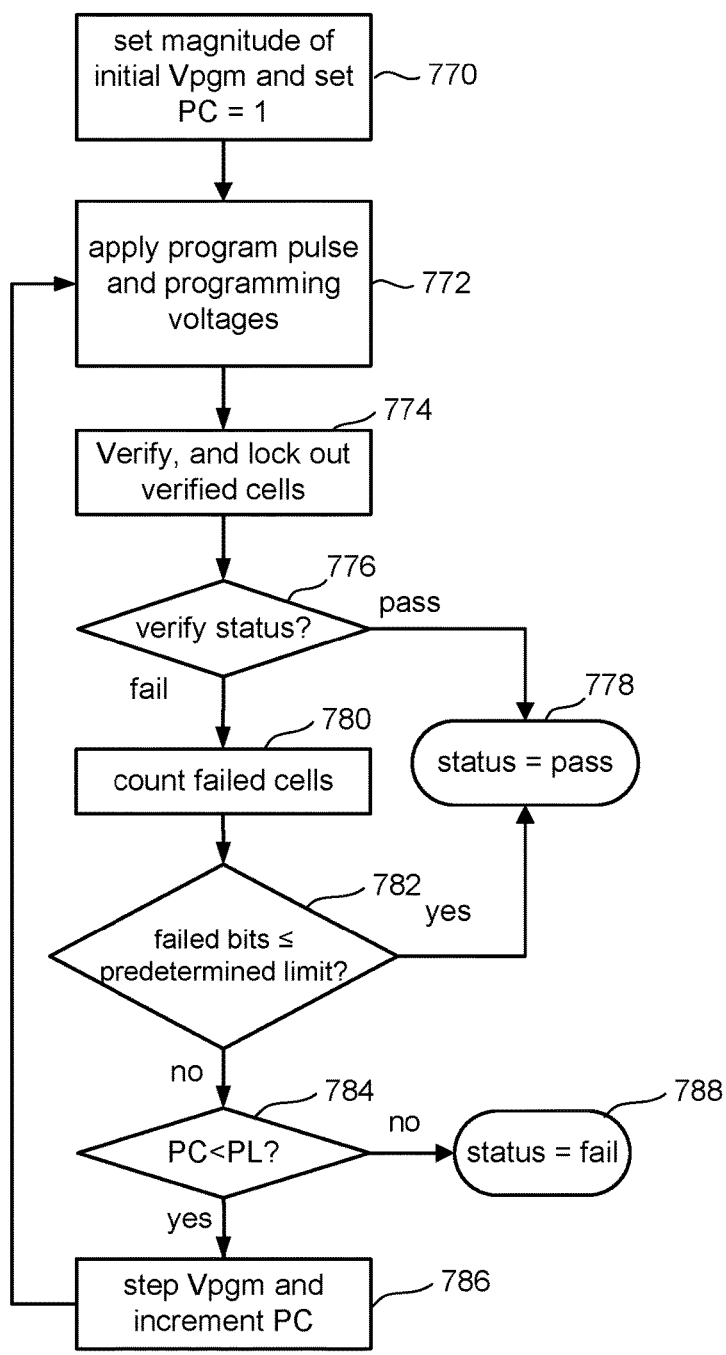
FIG. 7B is a flowchart describing one embodiment of a process for programming/writing data into memory cells connected to a common word line.

FIG. 7B is a flowchart describing one embodiment of a process for programming. The process of FIG. 7B is performed by the memory die in response to the steps of FIG. 7A (i.e., in response to the instructions, data and addresses from controller 122). In one example embodiment, the process of FIG. 7B is performed on memory die 108 using the one or more control circuits discussed above (see FIG. 1), at the direction of state machine 112. The process of FIG. 7B can also be used to implement the full sequence programming discussed above. The process of FIG. 7B can also be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 770 of FIG. 7B, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, then the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), then the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, then the programming process continues at step 784 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 788. This is one example of a program fault. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.5 volts). After step 786, the process loops back to step 772 and another program pulse is applied to the selected word line so that another iteration (steps 772-786) of the programming process of FIG. 7B is performed.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 6) or verify operation (e.g. see verify reference voltages Vv1, Vv2, Vv3, Vv4, Vv5, Vv6, and Vv7 of FIG. 6) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

In some embodiments, controller 122 receives a request from the host (or a client, user, etc.) to program host data (data received from the host) into the memory system. In some embodiments, controller 122 arranges the host data to be programmed into units of data. For example, controller 122 can arrange the host data into pages, partial pages (a subset of a page), word line units, blocks, jumbo blocks, or other units.

Figure 7C:
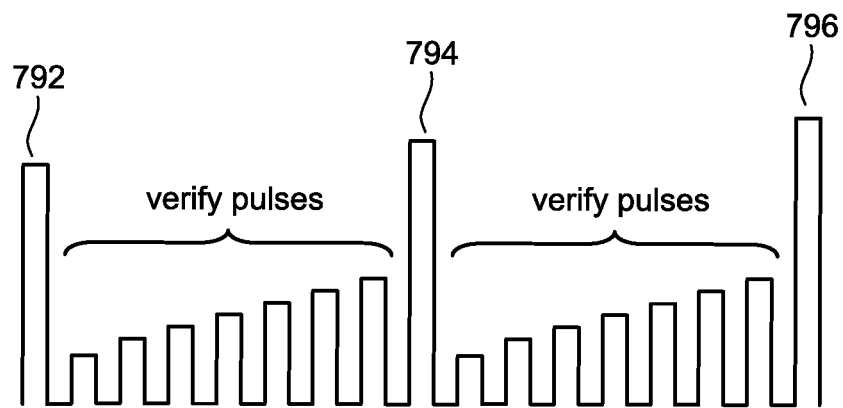
FIG. 7C depicts a word line voltage during programming/writing and verify operations.

Step 772 of FIG. 7B includes applying a program voltage pulse on the selected word line. Step 774 of FIG. 7B includes verification, which in some embodiments comprises applying the verify reference voltages on the selected word line. As steps 772 and 774 are part of an iterative loop, the program voltage is applied as a series of voltage pulses that step up in magnitude. Between voltage pulses, verify reference voltages are applied. This is depicted in FIG. 7C, which shows program voltage pulses 792, 794 and 796, applied during three successive iterations of step 772. Between program voltage pulses 792, 794 and 796, the system tests the memory cells to determine whether threshold voltages of the memory cells are greater than the respective verify reference voltages by applying the verify references voltages as verify pulses.

Figure 8:
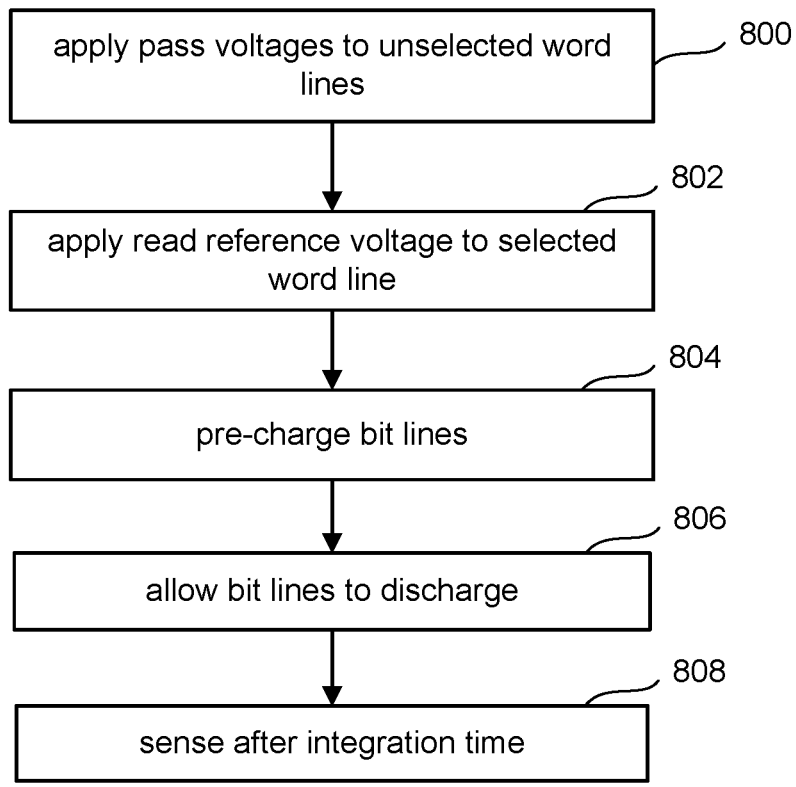
FIG. 8 is a flowchart describing one embodiment of a process for reading data from non-volatile memory cells.

FIG. 8 is a flowchart describing a sensing operation performed in order to read data from the memory cells. In step 800, a pass voltage is applied to unselected word lines so that unselected memory cells on a NAND string are conducting, which enables the system to test whether the selected memory cell conducts in response to the read reference voltage. This pass voltage is often referred to as Vread. In step 802, the appropriate read reference voltage, also referred to as Vcgr, is applied to the selected word line. In one example of a system that stores one bit per memory cell, Vcgr=0v, or a small voltage near 0v. In step 804, all of the bit lines are pre-charged. In one example embodiment, the bit lines are pre-charged by charging a capacitor in a sense amplifier and then putting the bit line in communication with the charged capacitor so that the bit line charges up. In step 806, the bit line is allowed to discharge, for example, by discharging the capacitor. After a predetermined time period, referred to as the "integration time" or "strobe time" the voltage of the capacitor is sampled to see whether the respective memory cell(s) conducted in step 808. If the memory cell conducts in response to Vcgr, then the threshold voltage of the memory cell is less than Vcgr. If Vcgr=0v and the memory cell turns on, then the memory cell is in the erased state and the data stored is 1. If Vcgr=0V and the memory cell does not turn on, then the memory cell is in the programmed state and the data stored is 0.

The sensing operation of the memory cells can be performed by sense amplifier circuits that can be part of the sense blocks 150 including SB1, SB2, . . . , SBp of FIG. 1. The following discussion looks at sense amplifier circuits in more detail and, more specifically, at sense amplifier architectures that can improve memory performance. As the amount of data that non-volatile memories can store increases, the performance requirements of the memory devices also increase. To meet market demand, there is an on-going effort to improve performance by reducing read times and program times. In typical sense amplifier designs, a major component of sensing times, both for data read and program or erase verify, are word line ramp up times, bit line ramp up times, and settling times, along with the sense times described in the flow of FIG. 8. The sense amplifier architectures of the embodiments presented here can lead reduced sensing times, specifically with respect to the final steps of FIG. 8.

Figure 9:
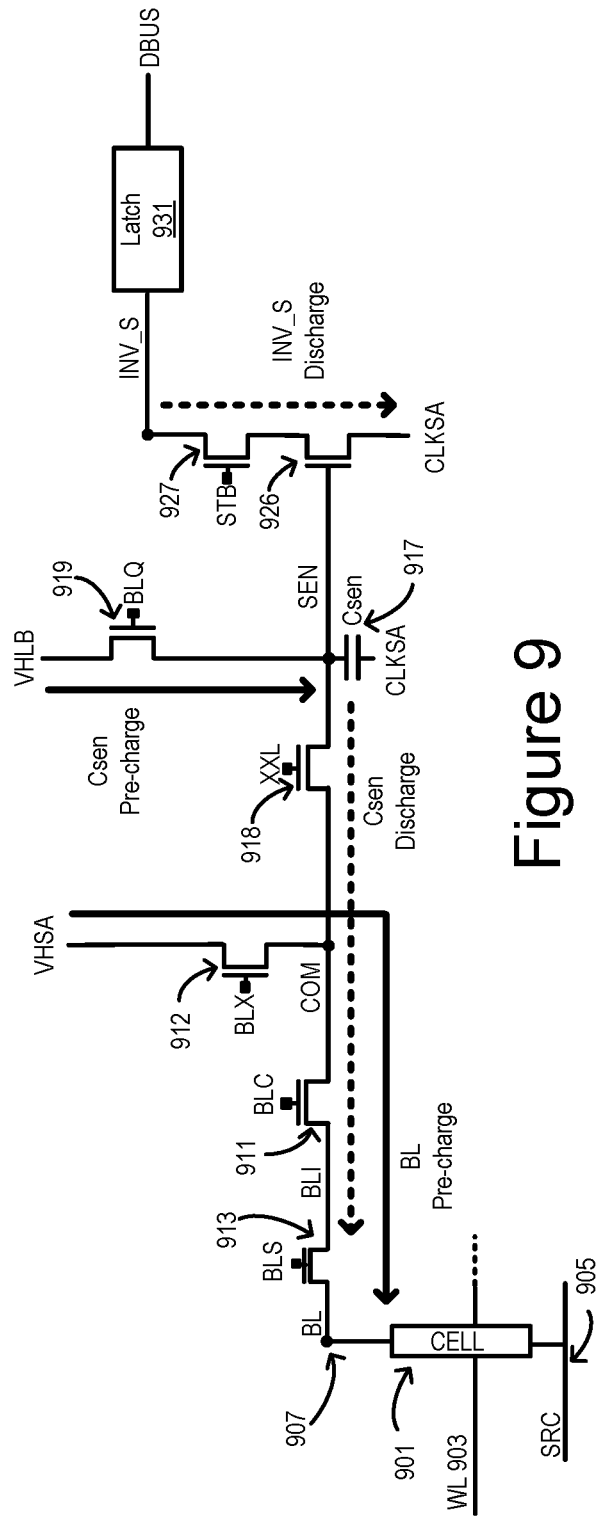
FIG. 9 illustrates an example of a sense amplifier architecture connected to a selected memory cell.

For comparison, FIG. 9 presents a simplified representation of a sense amplifier design that operates by discharging a sensing node or capacitor through a selected memory cell, and then using the resultant voltage on the sensing node to set the gate voltage on a transistor through which a node connected to a data latch is discharged.

More specifically, FIG. 9 illustrates an example of a sense amplifier architecture connected to a selected memory cell. A selected memory cell 901 is connected along a word line WL 903 and bit line BL 907, which is in turn connected to a bit line select switch BLS 913 on one end and a source line SRC 905 on the other end. The selected memory cell 901 can be from one of the various technologies described above. In the case of a NAND memory structure or other architectures where other control lines (such as for the select gates or the non-selected memory cells of a NAND string) require biasing for the sensing of a selected memory cell, these additional control lines are not represented in FIG. 9, but would be biased as needed for the sensing operations described in the following discussions. The bit line select switch 913 allows for one or more bit lines to be selectively connected to the internal bit line node BLI of the sense amplifier. (In the following, devices such as the transistor BLS 913 will frequently be referred to by the same name as the control signal applied to the device's gate.)

In the sense amplifier circuit of FIG. 9, the internal bit line node BLI is connected through the bit line clamp BLC 911 to the common node COM, which is in turn connected through the transistor XXL 918 to the sensing node SEN. A sensing capacitor Csen 917 is connected between the SEN node and a voltage level CLKSA. The COM node can be charged from a level VHSA by way of BLX 912 and the SEN node can be charged form a level VHLB by way of BLQ 919. The values of VHSA and VHLB will depend upon the particulars of the implementation and may be different or the same, where these will be high supply voltage levels for the sense amplifier and typically with a value on the order of a few volts. A transistor 926 is connected between the voltage level CLKSA and, through STB 927, to the node INV_S and has its control gate connected to the SEN node. A latch 931 is connected between the INV_S and a data bus. Only a single latch is shown, but in many cases a sense amplifier will be connected to multiple latches, such as in the case of multi-level memory cell operations. A typically implementation of a sense amplifier circuit will have a number of other elements related to sensing and other functions the sense amplifier may perform (such as biasing a bit line to a program enable or program inhibit level during a program operation), but these are not shown here to simply the figure and discussion.

Figure 10:
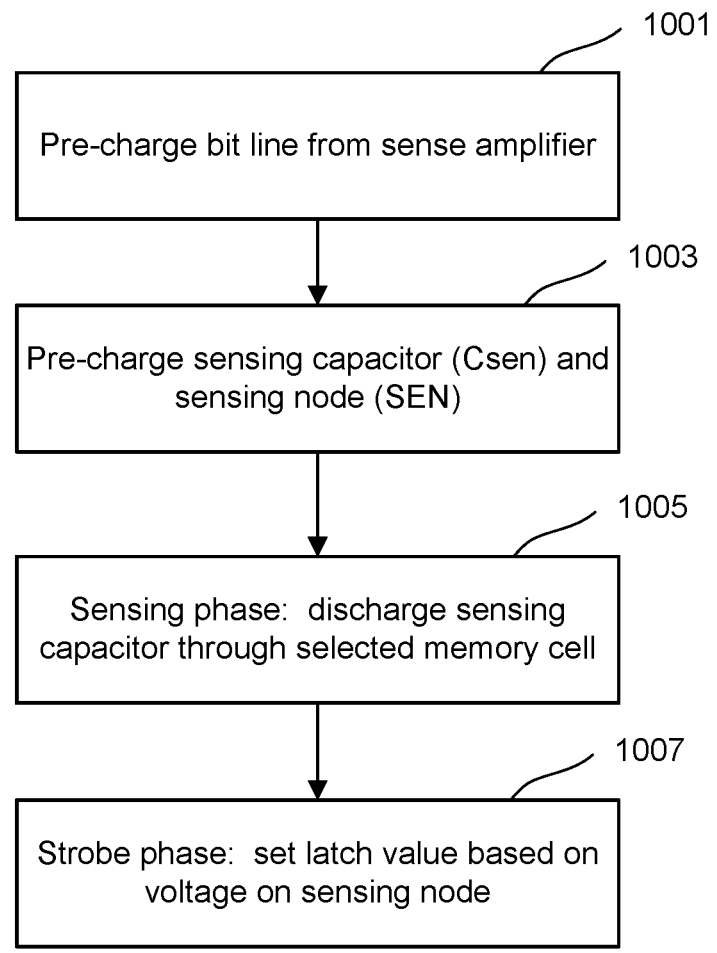
FIG. 10 is flowchart illustrating one embodiment for the operation of the sense amplifier circuit of FIG. 9 for a sensing operation.

FIG. 10 is flowchart illustrating one embodiment for the operation of the sense amplifier circuit of FIG. 9 during a sensing operation. At step 1001, the bit line 907 of a selected memory cell 901 is pre-charged by way of the internal bit line node BLI. The node BLI is pre-charged to VBLC-Vth voltage through the VHSA-BLX-BLC-BLI path as illustrated by the correspondingly labelled solid arrow in FIG. 9, where VBLC is the voltage applied to the gate of BLC 911 and Vth in this instance is threshold voltage of BLC 911. The gate of BLX 912 will receive a voltage VBLX that is higher than VBLC voltage to keep the transistor BLC 911 in saturation. The VBLX voltage will define the COM node's voltage, which will be VBLX-Vth, where in this instance Vth is threshold voltage of BLX 912.

In step 1003 the sensing capacitor Csen 917 and node SEN are pre-charged. Csen 917 is pre-charged through the VHLB-BLQ-Csen path as illustrated by the correspondingly labelled solid arrow in FIG. 9. The VHLB level can be the high voltage level for sense amplifier, so that Csen 917 can be charged up to a few volts, for example, with the specific value depending of the implementation. Steps 1001 and 1003 can be performed in either order or concurrently, but are before the following step 1005.

As part of the sensing process, whether for a data read or program verify, the selected memory cell 901 is biased as described above, such as with respect to step 800 of FIG. 8, by setting the voltage on the word line WL 903 to read voltage Vcgr, as well as biasing the other elements (e.g., non-selected word lines, select gates, source lines) as needed for the particular memory technology being used. For the example of NAND memory, a selected memory cell 901 will have either high resistance or low resistance based on the memory cell's state (either ON cell or OFF cell) for particular a Vcgr voltage relative to the data state of the memory cell.

The sensing phase is performed at step 1005. Subsequent to the pre-charge operations of steps 1001 and 1003 in which BL 907 and Csen 917 are pre-charged to their expected values, the CLKSA can be raised to increase the SEN node's voltage level. The Csen capacitor 917 is then discharged through the SEN-XXL-BLC-BL_I path by having XXL 918 and BLC 911 on. Based on the selected memory cell's state, the Csen capacitor 917 will either discharge or not discharge, as illustrated by the correspondingly labelled broken arrow of FIG. 9.

The sensing phase of step 1005 continues to discharge the SEN node voltage (in the case where the selected memory cell 901 is in an ON state) until it reaches the threshold voltage of the transistor 926. If the selected memory cell 901 is in a high resistance state, SEN will see little or no discharge and the SEN node will stay high. In a strobe operation at step 1007, the gate voltage of STB 927 goes high and, based on the voltage level on Csen 917/SEN node voltage, transistor 926 will either turn ON or turn OFF. Based on the state of transistor 926, the node INV_S will either have a high value for its voltage or be discharged through STB 927 and transistor 926 and have a low value. The result can then be latched into latch 931 and subsequently sent out on the data bus.

The read time for a memory cell mostly depends upon the time of the word line setup, bit line settling, the sense time of discharging the SEN node (step 1005) and strobe time (step 1007). In the sensing scheme illustrated with respect to FIGS. 9 and 10, the time allowed to discharge the Csen/SEN node should be long enough for a memory cell in the ON state to discharge the SEN node to less than threshold voltage of the NMOS transistor 926. In this way, when the strobe (taking the voltage on the gate of STB 927 high) is applied, the line INV_S will not discharge to a low voltage level if the selected memory cell is in an ON state. The rate at which Csen 917 and the SEN node discharge depends upon the current flowing though the selected memory cell. The time for discharging the SEN node enough to differentiate between an ON memory cell and an OFF memory cell, Tsen, can be expressed as:

$$Tsen=(\Delta Vsen*Csen)/Ion,$$

where: Ion is the current for an ON memory cell; $\Delta$Vsen is change in voltage required for the SEN node to discharge below the threshold voltage of NMOS 926; and in this equation Csen is the capacitance of the Csen 917.

Figure 11:
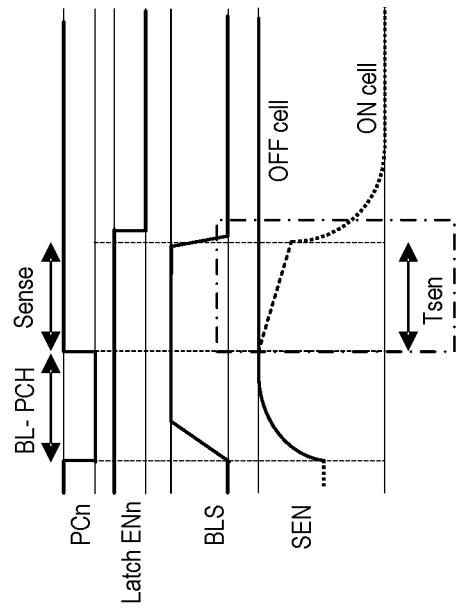
FIG. 11 is a set of waveforms illustrating some of the timings involved in the read process described with respect to FIGS. 9 and 10.

FIG. 11 is a set of waveforms illustrating some of the timings involved in the read process described with respect to FIGS. 9 and 10. On the top line is the inverse of the of the pre-charge enable signal PCn, which is low during the pre-charge phase and otherwise high. As illustrated above the PCn trace, PCn is low during the bit line pre-charge (BL-PCH) and SEN/Csen pre-charge and then subsequently high in the sense phase when SEN/Csen is discharged. The inverse latch enable signal Latch_ENn is high until, after the strobe, it is lowered to latch the sensing result based on the level on INV_S. The third trace is the bit line select signal BLS, which is high for the duration of the time during which the selected memory cell is connected to the sense amplifier, including both the pre-charge phase and subsequent sensing phase until the level on INV_S is established. At bottom is the trace for SEN node.

The voltage level on the SEN node is raised during the pre-charge phase, where in this embodiment the bit line BL 907 and Csen 917 are pre-charged concurrently. If the selected memory cell is in an OFF state, the SEN node will not discharge during the sense phase and SEN stays high, as indicated by the solid trace, and the NMOS transistor 926 will be on for the subsequent strobe phase, allowing INV_S to discharge. If the selected memory cell is in an ON state, the SEN node will discharge during the sense phase, as indicated by the broken line trace, and the NMOS transistor 926 will be off for the subsequent strobe phase, preventing INV_S from discharging.

Figure 12:
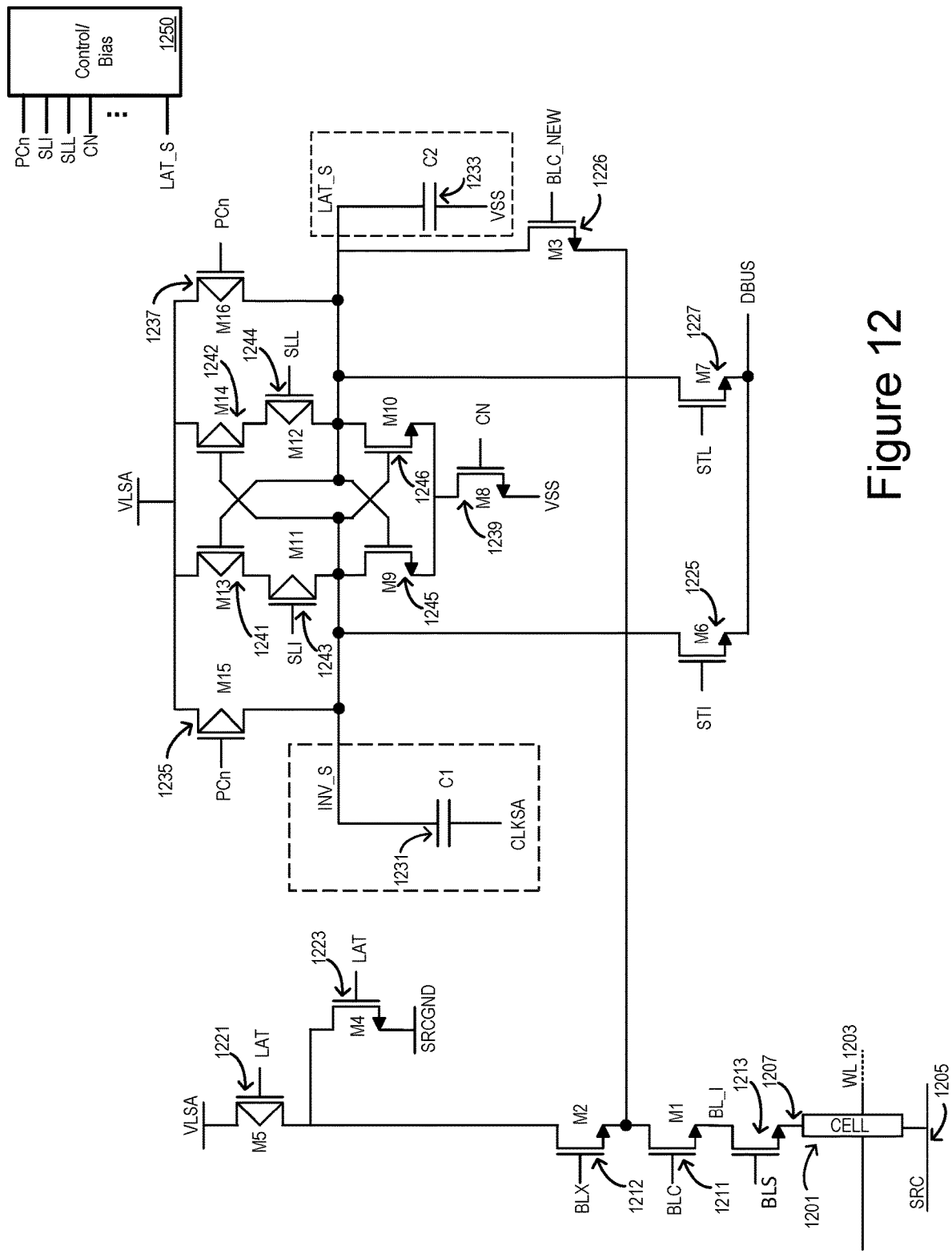
FIG. 12 presents an embodiment of a sense amplifier that can reduce sense time and strobe time by introducing local reference generator.

In FIG. 11, the time allotted for SEN to discharge in the sense phase is indicated Tsen and the combined sense and strobe phase are represented by the portion of the SEN trace enclosed in the box. As both data read operations and program verify operations require large numbers of such reads, memory performance can be improved if the sense and strobe intervals of a sensing operation can be reduced. FIG. 12 presents a memory architecture can that provide accurate read results while reducing both the sense time Tsen and strobe time.

FIG. 12 presents an embodiment of a sense amplifier that can reduce sense time and strobe time by the introduction of a locally generated reference voltage scheme in which the reference voltage for determining a memory cell's conductive state is generated within the sense amplifier, instead of using a threshold value as a reference, and using the latch architecture to strobe data.

An internal bit line BLI of the sense amplifier of FIG. 12 is connected through a bit line select switch BLS 1213 to a selected memory cell 1201. The selected memory cell 1201 can be the same as discussed above with respect to the selected memory cell 901 of FIG. 9. Similar to FIG. 9, the selected memory cell 1201 is connected along a word line WL 1203 and along a bit line BL 1207 between the BLS 1213 and source line SRC 1205 that is at a source line level SRCGND. The details of these elements can be as described above.

The internal bit line BLI is connected by bit line clamp M1 1211 with control signal BLC to a central internal node X. The node X is connectable to a high supply level VLSA by PMOS M5 1221 and to the low source line level SRCGND by NMOS M4 1223, where both M4 1223 and M5 1221 receive control signal LAT. M4 1223 and M5 1221 can be used to set a bit line to either a program inhibit or program enable level based on the control signal LAT. The control signal BLC, and the other control signals used to bias the switches of FIG. 12, can be generated by one or more control circuits 1250. Depending on the embodiment, the one or more control circuits 1250 and its elements can be specific to a single sense amplifier, shared between multiple sense amplifiers, part of more general on-die control circuitry 110, or various combinations of these.

More generally, referring back to FIG. 1A, the one or more control circuits 1250 can include control circuits within the sense blocks SB1, SB2, . . . , SBp, where the sense amplifiers can be located, along with the elements of the on-die control circuitry 110 (including the state machine, on-chip address decoder 114, and power control 116), along with the row decoder 124, column decoder 132, and other elements of read/write circuits 128. For example, the various control signals applied to the sense amplifier of FIG. 12 can be provided to logic and decoding circuitry in the sense blocks SB1, SB2, . . . , SBp based on instructions from the state machine 112 using voltage levels supplied by the power control 116. The biasing of the memory cell 1201, word line WL 1203, the source line SRC 1205, the bit line select switch BLS 1213 can be performed by biasing circuitry, drivers, and decoders in with the row decoder 124, column decoder 132, and elements of read/write circuits 128, again based on instructions from the state machine 112 using voltage levels supplied by the power control 116.

A latch is connected between the high supply level VLSA and low voltage level VSSA, and connected on one side to line INV_S and on the other side to line LAT_S, where LAT_S is connected to the central internal node X through NMOS M3 1216 having control signal BLC_NEW. A left (as presented in FIG. 12) leg is formed of the devices PMOS M13 1241, PMOS M11 1243, NMOS M9 1245, and NMOS M8 1239 series connected between VLSA and VSSA. A right leg is formed of the devices PMOS M14 1242, PMOS M12 1244, NMOS M10 1246, and NMOS M8 1239 series connected between VLSA and VSSA, where NMOS M8 1239 is shared by both legs and receives control signal CN. The legs are cross-coupled, with INV_S connected between M11 1243 and M9 1245, with the gates of M13 1241 and M9 1245 connected to LAT_S; and with LAT_S connected between M12 1244 and M10 1246, with the gates of M14

1242 and M10 1246 connected to INV_S. The gates of M11 1243 and M12 1244 are respectively connected to receive the controls signals SLI and SLL.

The lines INV_S and LAT_S are respectively connected through PMOSs M15 1235 and M16 1237 to high level VLSA for pre-charging. Both of M15 1235 and M16 1237 have control signal PCn. The lines INV_S and LAT_S are also respectively connected to the data bus DBUS through NMOS M6 1225 with control signal STI and M7 1227 with control signal STL. A capacitor C1 1231 is connected between INV_S and the level CLKSA and a capacitor C2 1223 is connected between LAT_S and the low voltage supply level of VSS.

In the architecture of FIG. 12, rather than performing a bit line pre-chare operation by the BLX path (M2 1212), the bit line can now be pre-charged by the PCn (M16 1244)-BLC_NEW (M3 1216)-BLC (M1 1211)-BL_I path. The voltage level of the BLC and BLC_NEW signals are VBLC and VX2 respectively. These voltage levels can be the same as the sense amplifier architecture of FIG. 9. Data transfer to DBUS is done through the STI (M6 1225) or/and the STL (M7 1227) transistor in FIG. 12.

In the architecture of FIG. 12, the LAT_S and INV_S nodes are pre-charged to the high level of the VLSA voltage, which can be on the order of a few volts, and the CLKSA signal reset to a high value, such as the same as VLSA. The LAT_S and INV_S nodes, and respective capacitors C1 1231 and C2 1233, will pre-charge through the PCn transistor (M15 1235 and M16 1237). When the PCn signal goes low (connected to VSS), the LAT_S and INV_S nodes connect to the high voltage level VLSA voltage.

Figure 13:
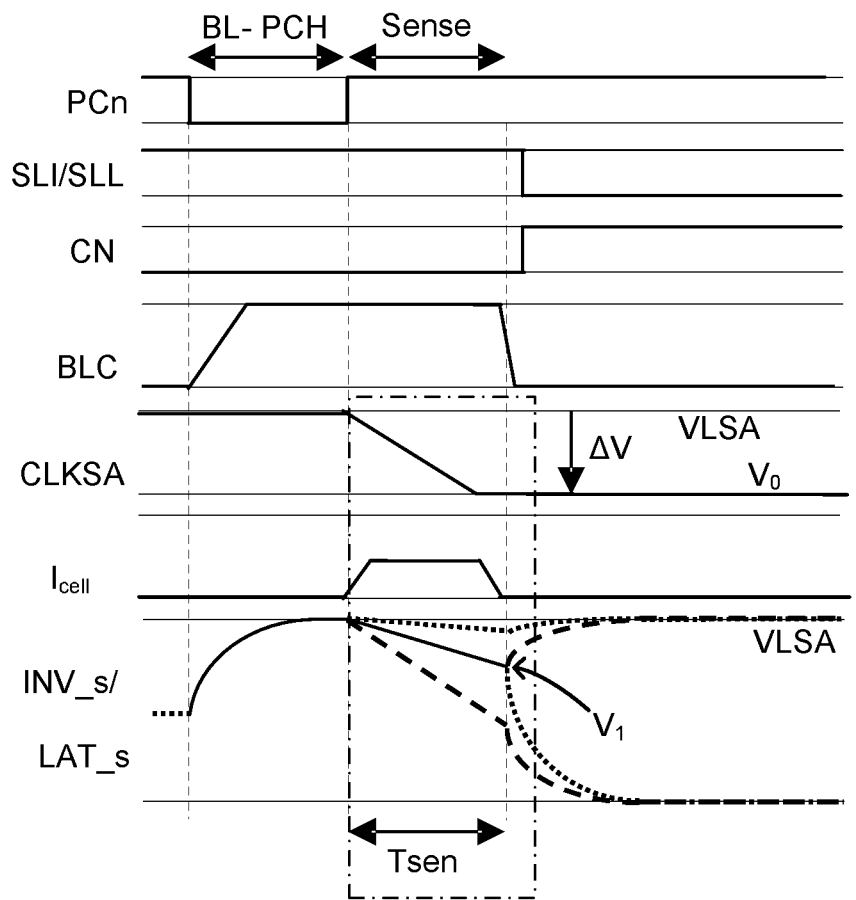
FIG. 13 illustrates an example set of waveforms for an embodiment of a sense amplifier with the architecture of FIG. 12.

FIG. 13 illustrates an example set of waveforms for an embodiment of a sense amplifier with the architecture of FIG. 12. The control signals PCn, SLI/SLL, CN, BLC, and CLKSA are from the control/bias circuitry 1250, with hell the resultant current through the selected memory cell and INV_S/LAT_S the corresponding voltage levels on those nodes. The pre-charge phase, in which the bit line, the LAT_S and INV_S nodes, and respective capacitors C1 1231 and C2 1233, are pre-charged is marked as BLI-PCH. As shown in the top trace, PCn is taken low to turn on the PMOSs M15 1235 and M16 1237, connecting INV_S and LAT_S to VLSA. In the latch, SLI/SLL is high, to keep the PMOSs M11 1243 and M12 1244 off, and CN is low to keep M8 1239 off. To also charge up the internal bit line node BLI, BLC and BLC_NEW both go high to turn on M1 1211 and M3 1216. CLKSA is high. This biasing of the sense amplifier results in the INV_S and LAT_S being charged up as illustrated at the bottom of FIG. 13.

At the start of the sense phase, PCn is taken high to cut off the pre-charging of INV_S and LAT_S. SLI/SLL stays high, CN stays low, and BLC/BLC_NEW stay high. CLKSA is ramped down from a high level (such as VLSA) by an amount ΔV. The level on LAT_S starts discharging (by way of internal node X and BLI to the selected memory cell) based on the I_cell current value. Consequently, at the end of sensing phase the LAT_S node voltage can have two different values, based on either an OFF selected memory cell or an ON selected memory cell. In the trace of the LAT_S node, the voltage corresponding to an OFF selected memory cell has higher voltage than the LAT_S node voltage corresponding to an ON selected memory cell:

$$dV_{LAT\_S} = (Tsen * I_{cell})/C2,$$

where $dV_{LAT\_S}$ is the change of the voltage level on LAT_S, Tsen is the duration of sense phase, Icell is the current through the selected memory cell, and C2 is the capacitance of C2 1233. In FIG. 13, the box is formed around the sense and strobe phase.

INV_S and C1 1231 are used as part of a local reference generator for the sense amplifier, with the CLKSA signal a generating a local reference voltage on C1 1231. After completion of the pre-charge operation, the PCn transistor M15 1235 will be in cut off mode so that INV_S node remains floating. As the CLKSA signal discharges an amount ΔV from VLSA to an intermediate voltage V0, the INV_S signal also discharges from the VLSA voltage to a voltage V1 voltage. The discharge of the INV_S to V1 voltage is due to the connection of the lower plate C1 1231 to the CLKSA signal, while the INV_S node (and upper plate of C1 1231) is floating. The INV_S final voltage, V1, is decided by coupling ratio of capacitor C1 1231 from the INV_S node to the CLKSA signal. This final voltage value, V1, of the INV_S signal will behave as a reference voltage to differentiate an ON selected memory cell and from an OFF selected memory cell by comparison with the final voltage of the LAT_S signal.

Figure 14:
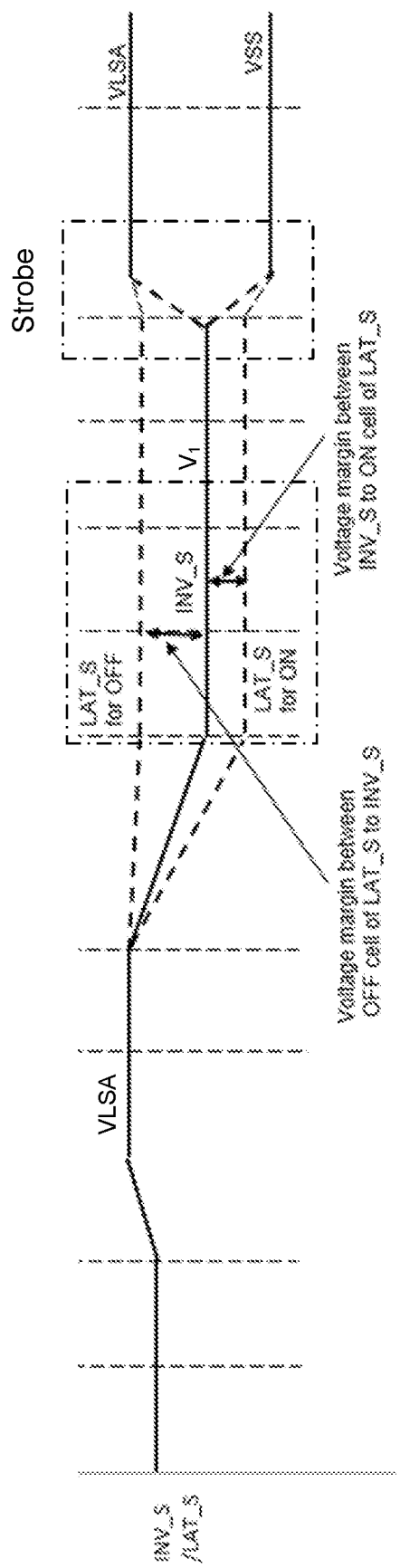
FIG. 14 illustrates the INV_S and LAT_S waveforms of FIG. 13 in more detail.

FIG. 14 illustrates the INV_S and LAT_S waveforms of FIG. 13 in more detail. The region in the first broken box illustrates the signal responses of INV_S and LAT_S after completion of a sense operation as shown in FIG. 13, where this region is shown extended relative to the representation of FIG. 13. As shown in FIG. 14, for an OFF selected memory cell LAT_S stays high, while for an ON selected memory cell LAT_S discharges from its pre-charge level. The INV_S level drops to a level V1 that is intermediate to the two LAT_S values, providing the margins illustrated in FIG. 14.

After completion of the sense phase, the INV_S and LAT_S signals have their relative values determined and the strobe phase follows. In FIG. 13, this corresponds to the portion in the box around CLKSA, hell, INV_S and LAT_S after the Tsen portion. In this region, SLI and SLL go low (turning on M11 1243 and M12 1244), CN goes high (turning on M81225), and BLC/BLC_NEW go low (cutting of the path to BLI and $I_{cell}$). The behavior of INV_S and LAT_S during the strobe phase are shown in more detail in FIG. 14, where the strobe phase is in the second broken box.

Figure 15:
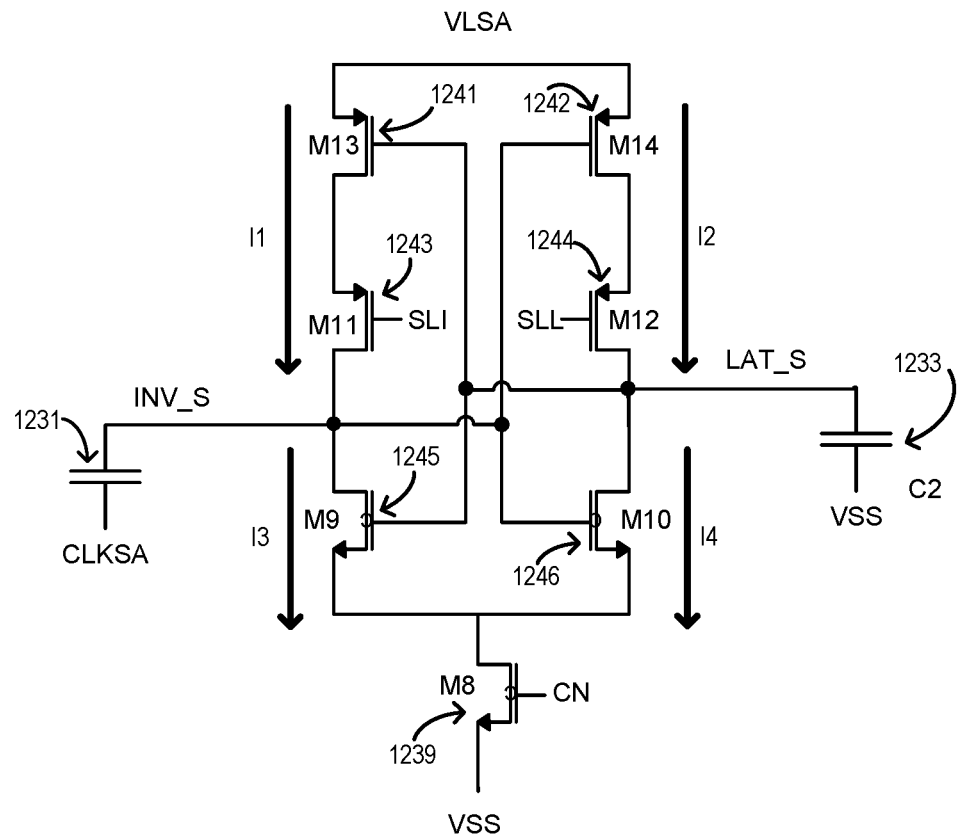
FIG. 15 illustrates the operation of the latch structure of the sense amplifier of FIG. 12 during the strobe phase.

FIG. 15 illustrates the operation of the latch structure of the sense amplifier of FIG. 12 during the strobe phase. The INV_S and LAT_S signals are the inputs to the latch structure and the strobe operation uses these signal voltages to store the ON cell/OFF cell value in to a latch. In FIG. 15, the current flowing through M13 1241-M11 1243 is labelled I1, the current flowing through M14 1242-M12 1244 is labelled I2, the current flowing through M9 1245 is labelled I3, and the current flowing through M10 1243 is labelled I4.

If the selected memory cell is OFF, then the LAT_S voltage is higher than the INV_S voltage due to I3>I4. As a result, the INV_S signal discharges faster than the LAT_S signal and at the end of operation the LAT_S node voltage is VLSA and INV_S node voltage is VSS voltage. If the selected memory cell is ON, then the LAT_S voltage is lower than the INV_S voltage due to I3<I4; and as a result, the LAT_S signal discharges faster than the INV_S signal and at the end of operation LAT_S node voltage is VS S and INV_S node voltage is the VLSA voltage. The strobe operation is performed through the CN signal, where when the CN signal ON the latch is able to store data.

Figure 16:
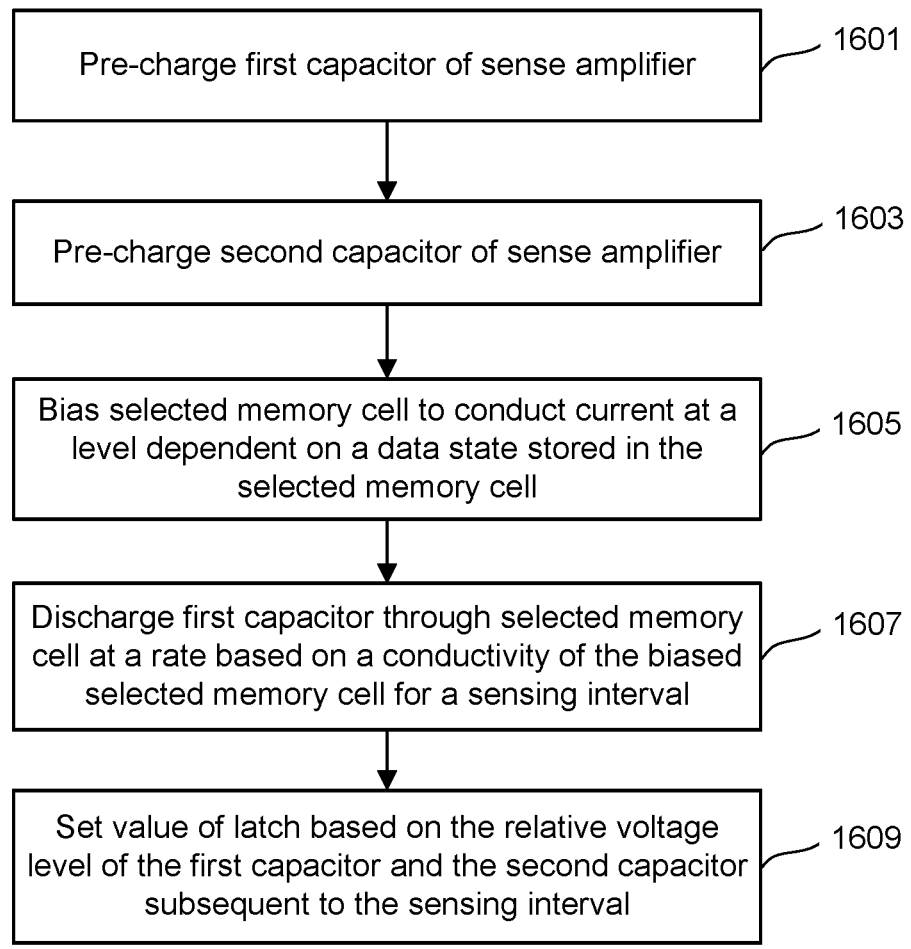
FIG. 16 is a high-level flowchart for one embodiment for the operation of the sense amplifier architecture of FIG. 12.

FIG. 16 is a high-level flowchart for one embodiment of a sensing operation based on the sense amplifier architecture of FIG. 12. At step 1601 a first capacitor C2 1233 of the sense amplifier is pre-charged and at step 1603 a second capacitor C1 1231 is pre-charged. In the embodiments described above, C2 1233 and C1 1231 are charged concurrently through respective pre-charge transistors M16 1237 and M15 1235, where the control signals PCn are from the control/bias circuitry 1250. After the pre-charged phase follows the sense phase, in which the capacitor C2 1233 is discharged based on the conductivity of the selected memory cell. For the sense phase, the selected memory is biased at step 1605 to conduct current at a level dependent upon a data state stored in the selected memory cell. The biasing of the selected memory cell can be performed before, after, or concurrently with the pre-charging of the capacitors C2 1233 and C1 1231. The biasing of the selected memory call can be performed, for example, by biasing circuitry, drivers, and decoders in with the row decoder 124, column decoder 132, and elements of read/write circuits 128, based on instructions from the state machine 112 using voltage levels supplied by the power control 116. The biasing of the selected memory for sensing may also require biasing of other elements of the memory array: for example, in a NAND structure the non-selected memory cells and select gates on the same NAND string as a selected memory are also placed into an ON state.

Once the capacitors C2 1233 and C1 1231 are pre-charged and the selected memory cell is biased, the capacitor C2 1233 is discharged though the selected memory cell at step 1607, where the capacitor C2 1233 discharges along the path through BLC_NEW M3 1226 and BLC M1 1211 at a rate based on the conductivity of the selected memory cell. After discharging capacitor C2 1233 for the sensing interval TSEN, a latch value is set in the sense amplifier at step 1609 based on a relative voltage level of the first capacitor and the second capacitor. The latch structure includes the transistors M8 1239, M9 1245, M10 1246, M11 1243, M12 1244, M13 1241, and M14 1242, and its operation is described in more detail with respect to FIGS. 13-15. Relative to the architecture of FIG. 9, the architecture of FIG. 12 can achieve faster time for both the sense phase of step 1607 and the strobe phase of step 1609. With respect to the sense phase, the time needed to discharge the capacitor C2 1233 sufficiently to distinguish between an ON state and an OFF state of the selected memory cell can be less. For the strobe phase, the use of the capacitor C1 1231 allows for a relatively low voltage margin and with use of a shorter strobe time.

Figure 17:
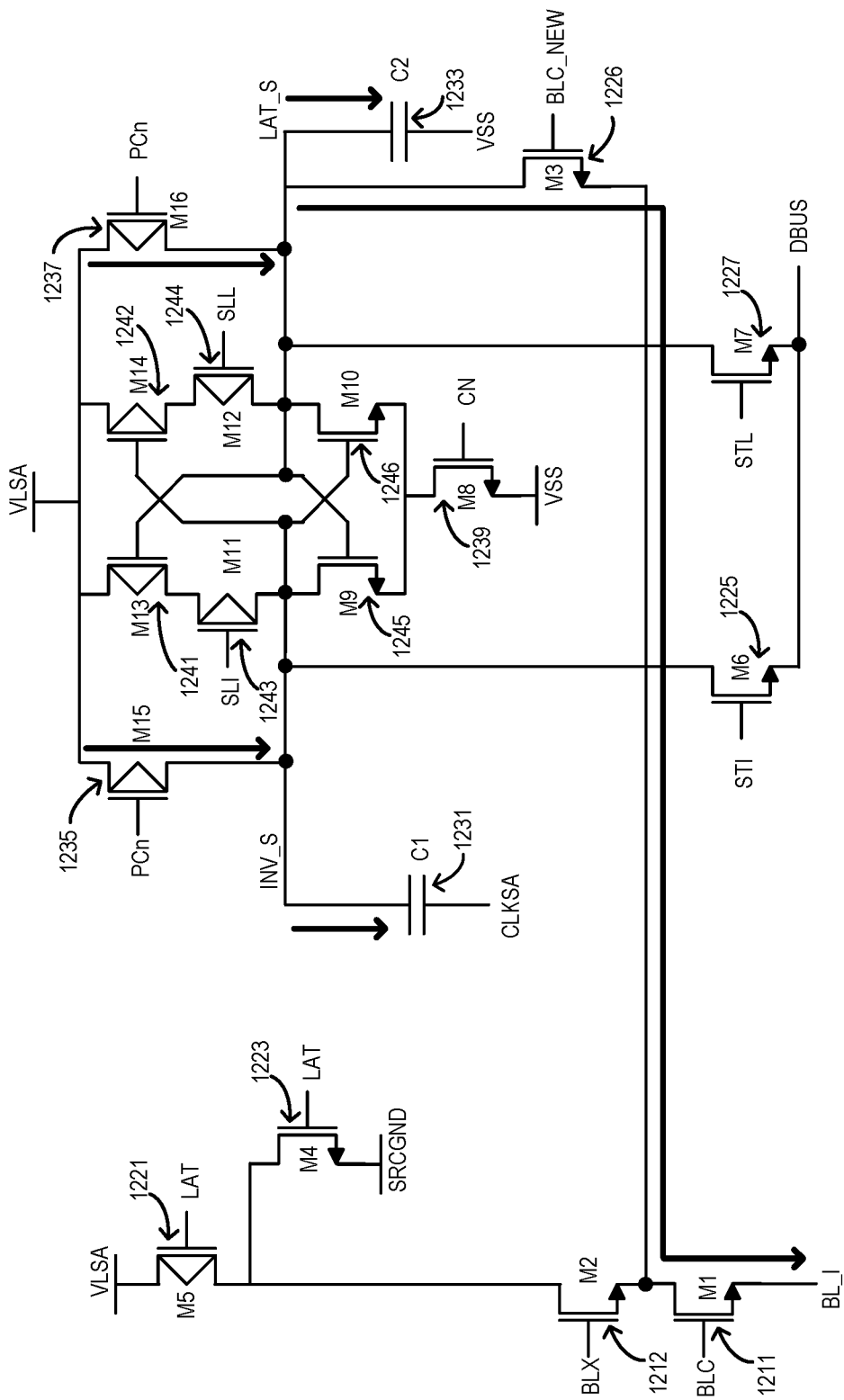
FIGS. 17, 19, and 21 illustrate current flows within the sense amplifier of FIG. 12 at different phases of the sensing process.
Figure 18:
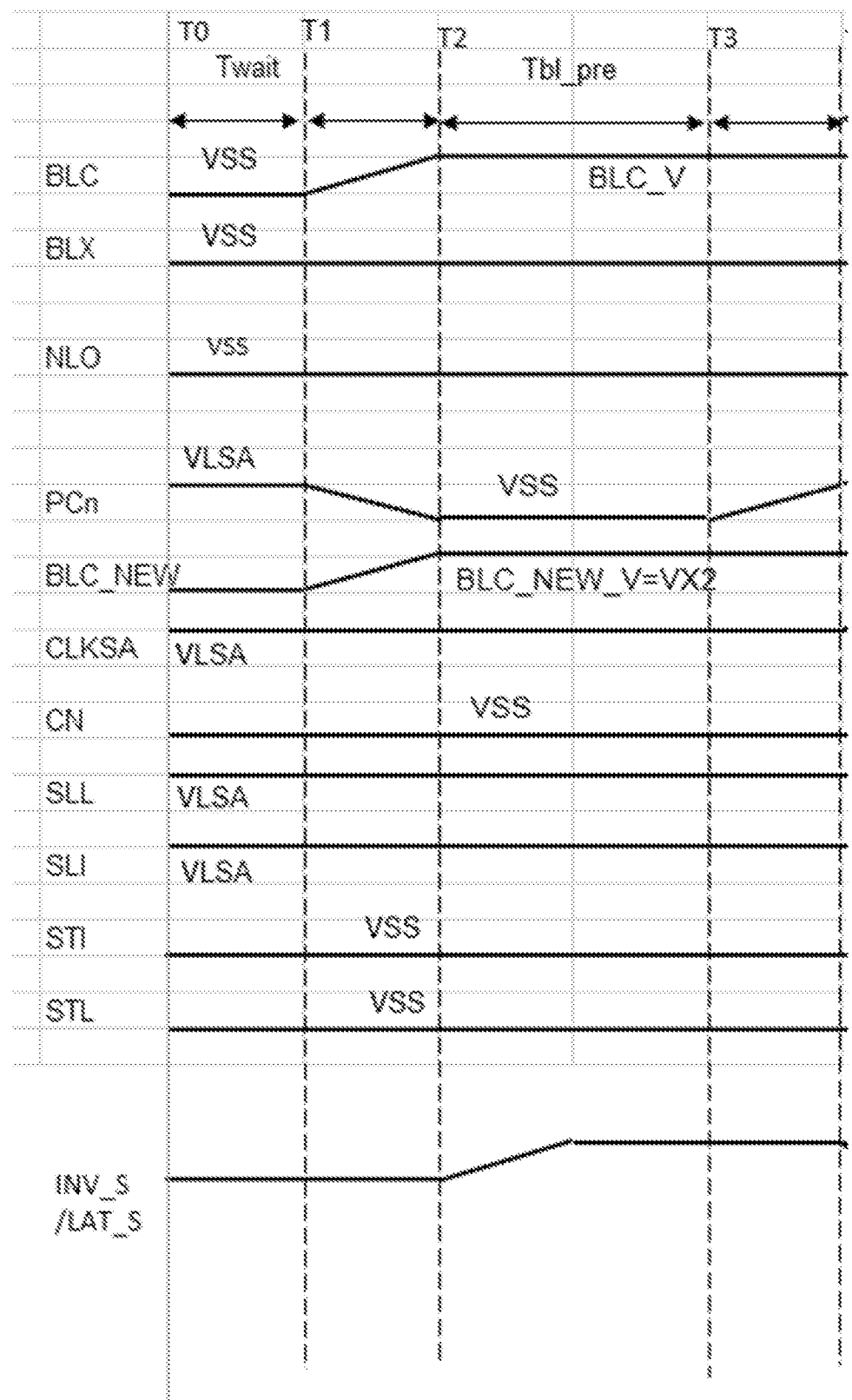
FIGS. 18, 20, and 22 present a more detailed set of waveforms for the control signals of the sense amplifier of FIG. 12 at different phases of the sensing process.
Figure 19:
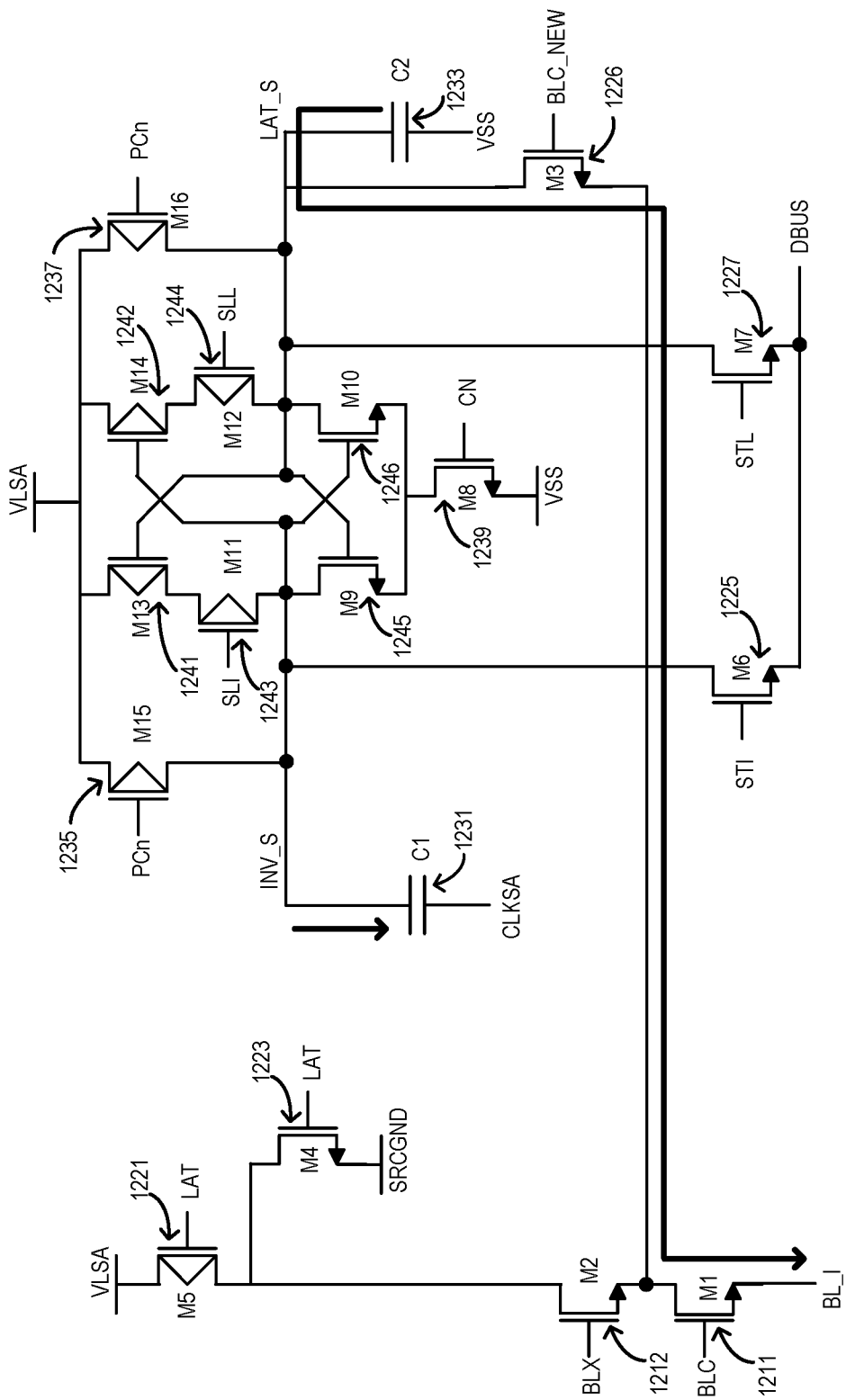
Figure 20:
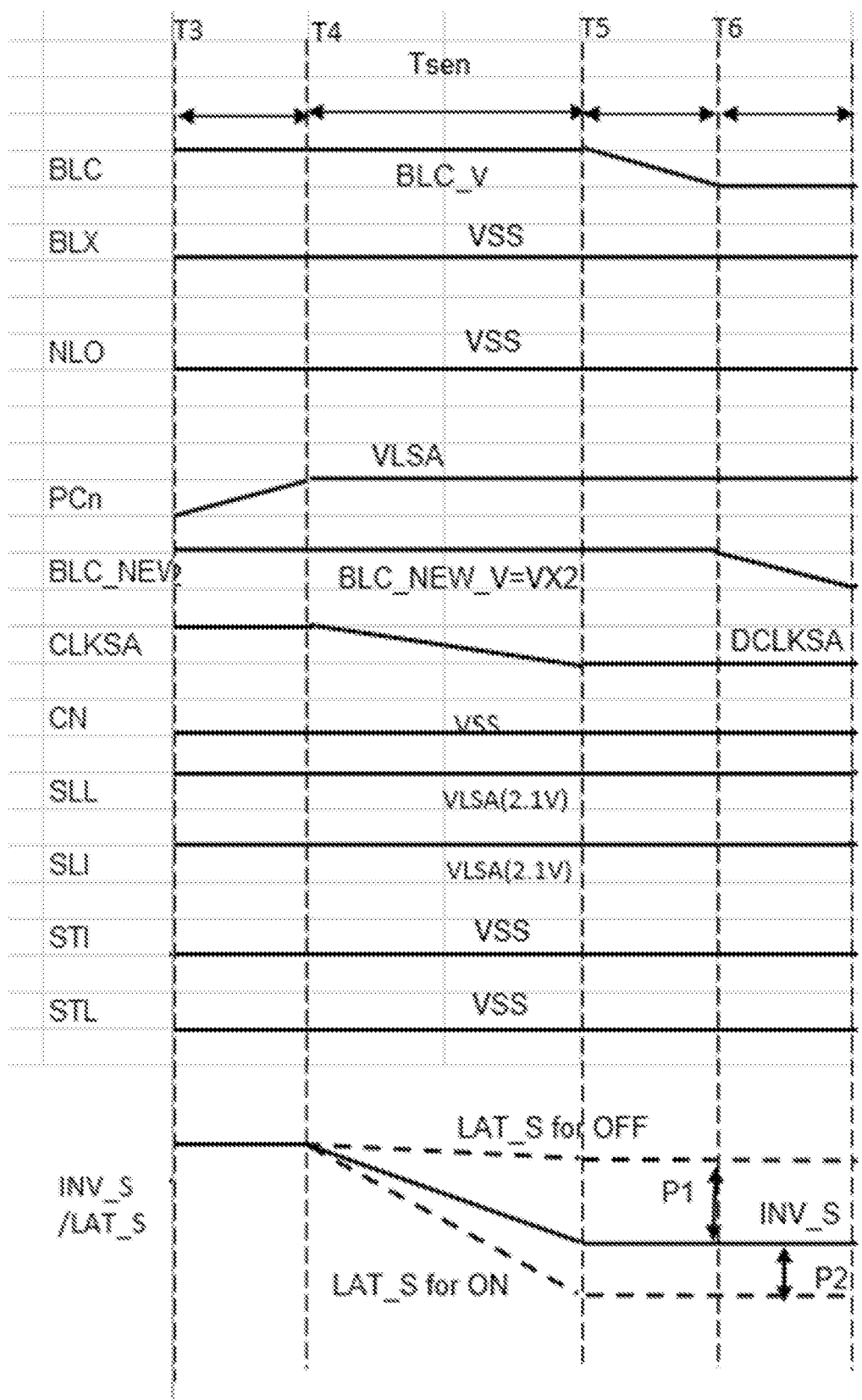
Figure 21:
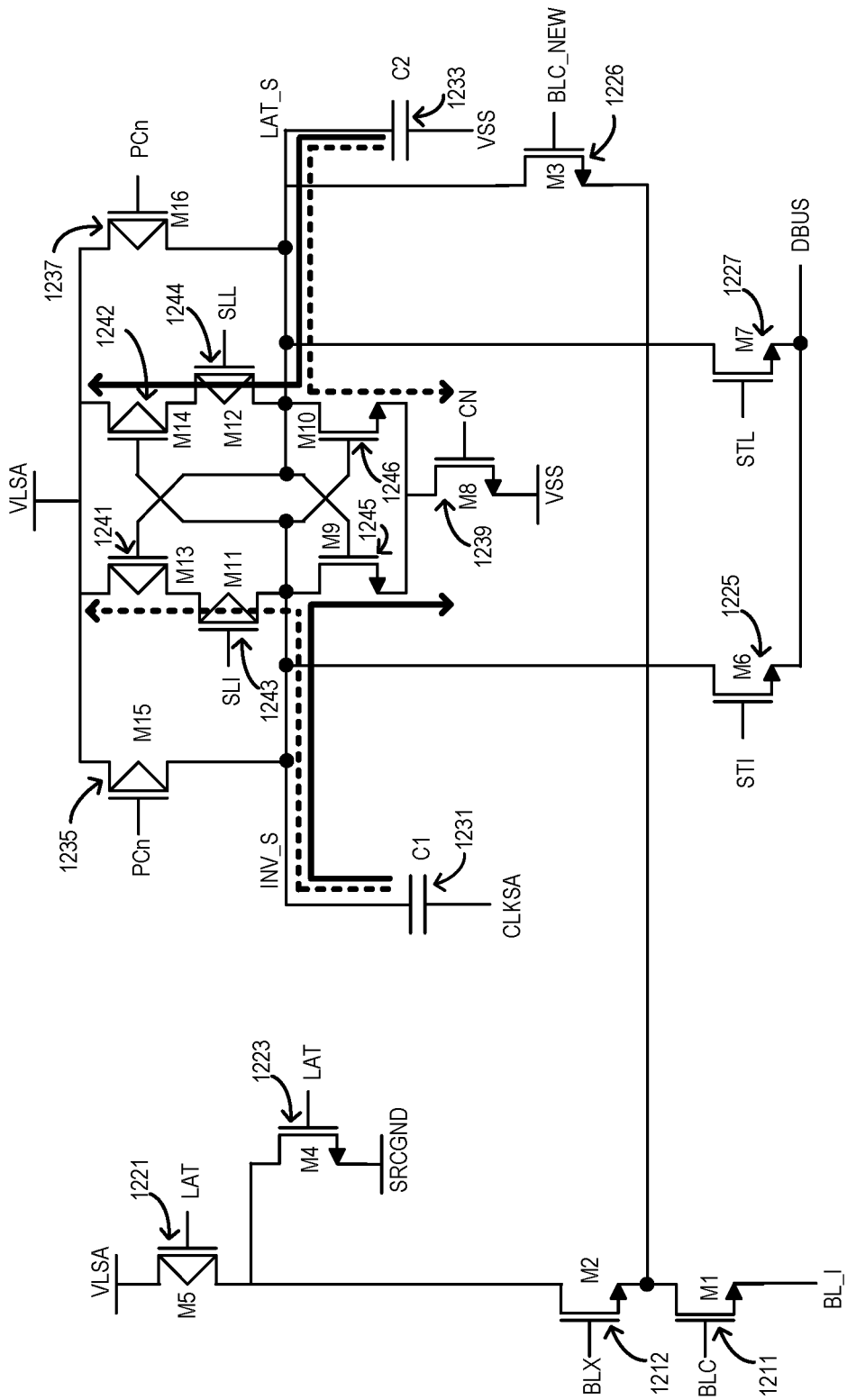
Figure 22:
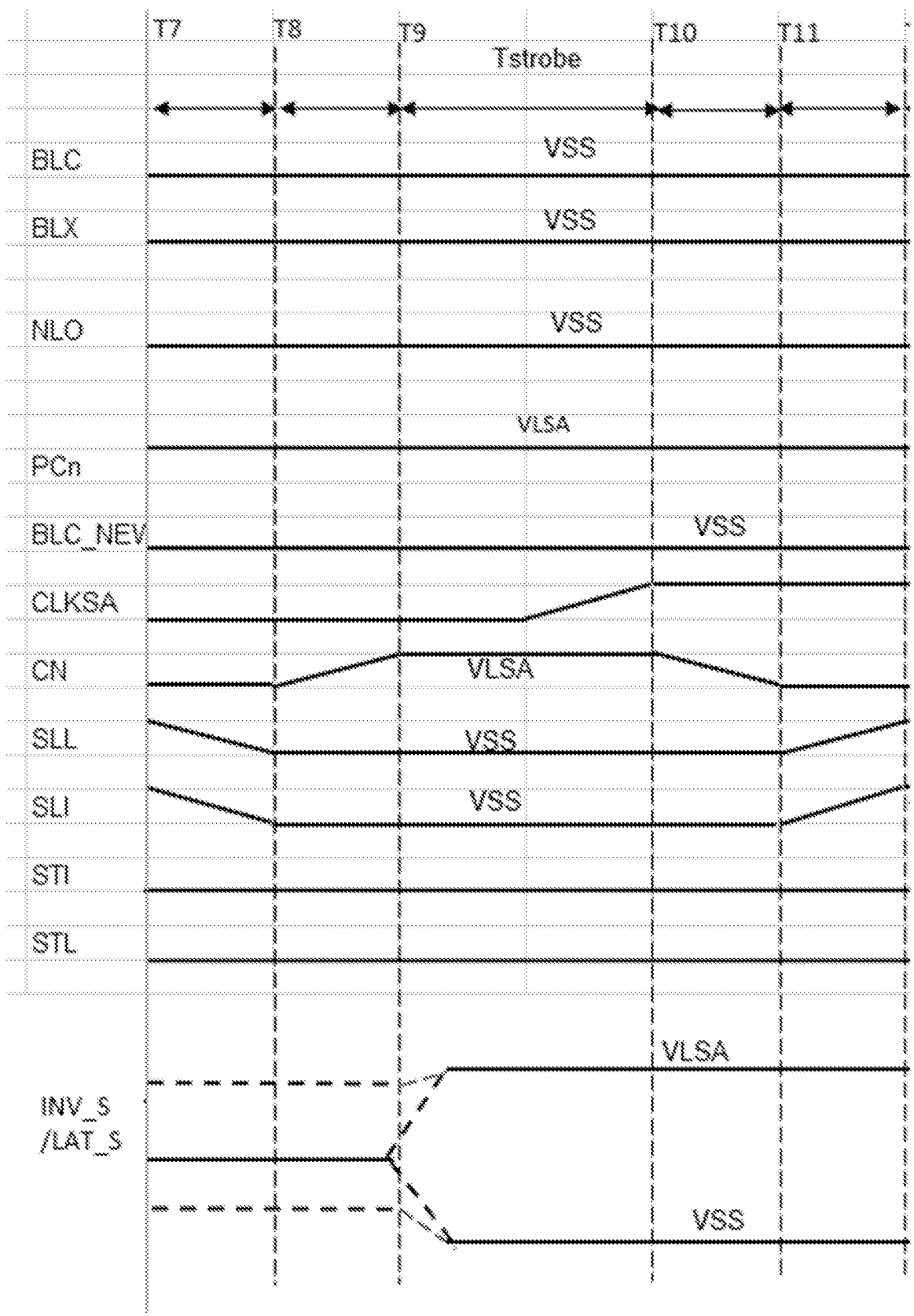
Figure 23:
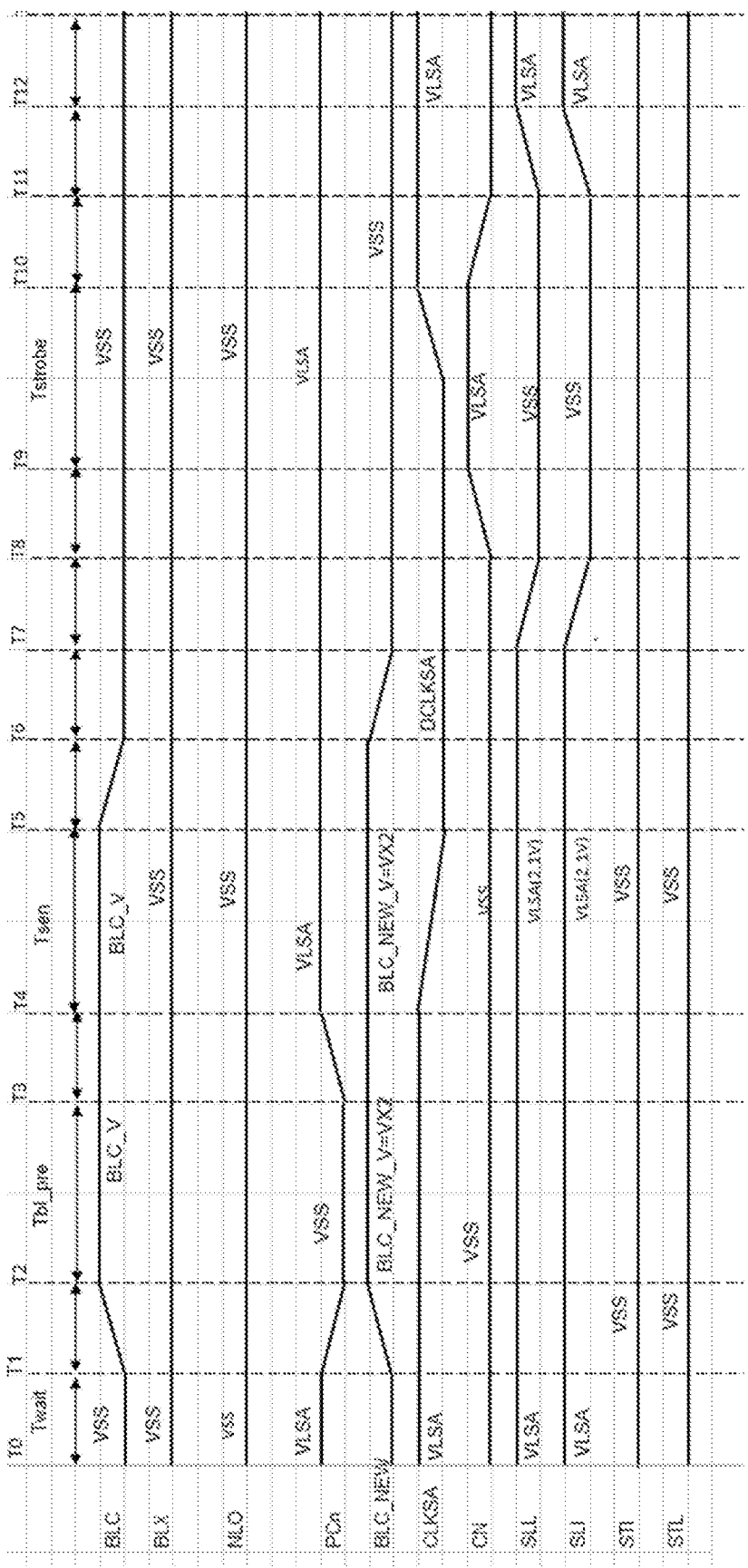
FIG. 23 combines the waveforms of FIGS. 18, 20, and 22 to cover the full sensing process.
Figure 24:
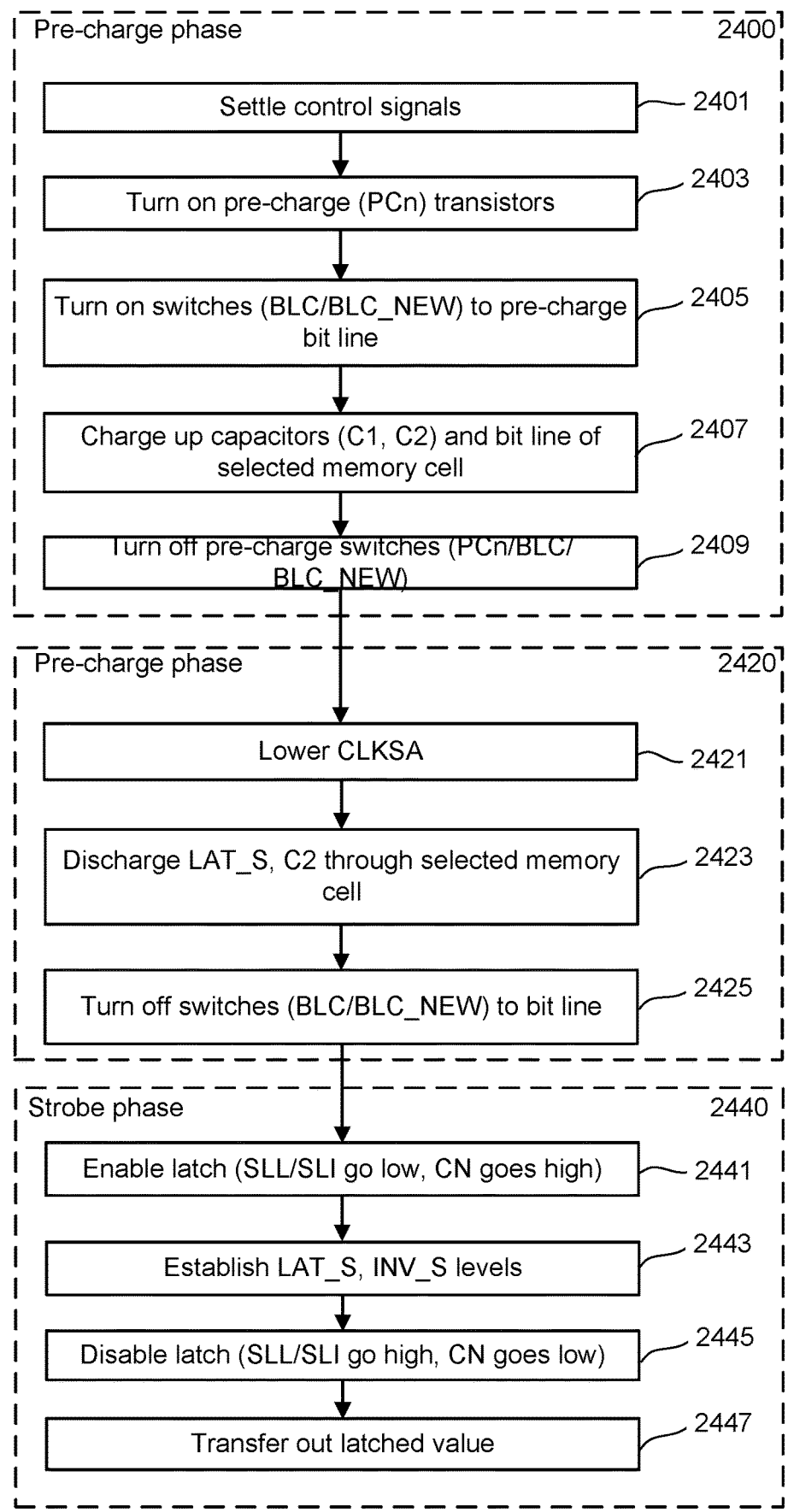
FIG. 24 is a more detailed flowchart one embodiment for the operation of sense amplifier architecture of FIG. 12.

FIGS. 17-24 consider the operation of the sense amplifier architecture of FIG. 12 in more detail. More specifically, FIGS. 17, 19, and 21 illustrates current flows within the sense amplifier at different phases of the sensing process. FIGS. 18, 20, and 22 present a more detailed set of waveforms for the control signals of the sense amplifier at different phases of the sensing process. FIG. 23 combines the waveforms of FIGS. 18, 20, and 22 to show how this figures flow one into another. FIG. 24 is a more detailed flowchart one embodiment for the operation of sense amplifier architecture of FIG. 12.

FIG. 17 illustrates the current in the sense amplifier of FIG. 12 during the bit line pre-charge phase. To sense a set of selected memory cells along a word line, the bit lines corresponding to the selected bit lines are charged to the expected voltage from their corresponding sense amplifiers. The bit line pre-charge operation is used to decide the drain-source (Vds) voltage across selected memory cell, and the Vds voltage across memory cell will in turn decide the amount of current flowing in memory cell. The bit line can be pre-charged through the VLSA-PCn (M16 1244)- BLC_NEW (M3 1216)-BLC (M1 1211)-BL_I path. The BLC signal has a high voltage value VBLC that is used to define the bit line voltage. The BLC_NEW receives a voltage value VX2 to behave as a switch. As the PCn signal is low, the M15 1235 and M16 1237 PMOS transistors are on to connect the VLSA supply, with BLC_NEW applied to M3 1216. At the same time the C1 1231 and C2 1233 capacitors will charge through the PCn signal transistors M15 1235 and M16 1237 up to the VLSA voltage level. The arrows in FIG. 17 show the bit line charging and capacitor charging paths in the sense amplifier.

FIG. 18 is a timing diagram for the control signals of the sense amplifier of FIG. 12 during the pre-charge phase. In some embodiments of FIG. 18 (and of FIGS. 20, 22, and 23), VLSA and VSS can respectively be the high and low power supply levels, with the other signal level voltage being specific levels used for control of sense amplifier operation. At time T0, all signals are at reset point and T0 to T1 is just wait time to settle all signals. At time T1, the BLC and BLC_NEW signals start ramping up and, at the same time, the PCn signal can start ramping down, causing the transistors M1 1211, M3 1216, M15 1235, and M16 1237 to turn on. At time T2 the bit line starts ramping up, as the BLC-BLC_NEW and PCn signals are at their respective ON voltages, and at the same time INV_S and LAT_S and their respective capacitors C1 1231 and C2 1233 also start charging through the VLSA-PCn (M15 1235, M16 1237)-C1 1231/C2 1233 path. At time T3, the BLC and BLC_NEW signals remain at their respective high (ON) voltages, but the PCn signal voltage changes from VSS to VLSA voltage to turn off the PMOSs M15 1235 and M16 1237. This shuts off the pre-charge paths and at the end of the T3-T4 interval, the bit lines will have settled to their expected voltages and INV_S and LAT_S will also have settled. The PCn signal voltage is at the VLSA voltage and the BLC and BLC_NEW signals are at their respective high voltages.

FIG. 19 illustrates the current in the sense amplifier of FIG. 12 during the sensing phase. For the sense amplifiers for each of the bit lines being sensed, the BLC signal is at VBLC and the BLC_NEW signal is at VX2, which can be higher than VLSA so that the corresponding switches are fully on, and the PCn signal is at VLSA voltage so that the pre-charge PMOSs M15 1235 and M16 1237 are off. As soon as sensing phase starts, if the corresponding selected memory cell is ON the C2 1233 will start discharging through the C2 1233-BLC_NEW (M3 1216)-BLC (M1 1211)-BL_I path. Initially, the CLKSA signal is at the high VLSA voltage level, but as the sensing phase starts the CLKSA signal discharges to a value DCLKSA that is less than the CLKSA signal's initial value. Based on the sensing voltage applied to the selected word line relative to the threshold voltage of a selected memory cell, the selected memory cell will either be ON or OFF. If the memory cell is behaving as an OFF cell, then C2 1233 will not discharge and the LAT_S node should remain at the pre-charge level of the VLSA voltage, although due to leakage at the LAT_S node the voltage may slightly drop. If the selected memory cell behaves as an ON memory cell, then C2 1223 will discharge and its final voltage depends upon time available for the LAT_S node to discharge and on the current (ON memory cell) flowing through memory cell. The discharge current path for an ON memory cell is represented by the arrow from C2 1223 to BLI.

The DCLKSA value for the lower plate of C1 1221 can be generated from a voltage regulator and the DCLKSA value depends upon requirements of a given embodiment. During the sensing phase the CLKSA signal voltage changes from the VLSA to the DCLKSA value with a ramp-down rate so that the INV_S node voltage also discharges to a certain voltage due to coupling effect, as illustrated by the arrow across C1 1221. As the capacitor C1 1221 does not typically have a 100% coupling ratio, the INV_S signal will not fully discharge to the DCLKSA value. After completion of sensing phase, the LAT_S nodes will have a voltage level that is based on the resistance offered by the memory cell. Referring back to the detail of FIG. 14, the LAT_S signal remains at same voltage of VLSA (less leakage) if the memory cell is OFF, and drops to a lower voltage is if the memory cell is ON. The INV_S signal voltage should be in between these two voltages for LAT_S, which is controlled by the DCLKSA value.

FIG. 20 is a timing diagram for the control signals of the sense amplifier of FIG. 12 during the sense phase, overlapping with FIG. 18 for the interval T3 to T4. At time T4, the BLC and BLC_NEW signals continue to have the respective VBLC and VX2 voltages. PCn signal has the VLSA voltage. At this the point, the LAT_S node (and C2 1233) start discharging at a rate defined by the selected memory cell's resistance. As noted in the previous paragraph, the LAT_S node's voltage remains high if the memory cell is OFF and offers high resistance. If the selected memory cell is ON, then the LAT_S node will discharge to a lower voltage. As indicated on the bottom traces of FIG. 20, P1 is the voltage difference between LAT_S signal of OFF cell to INV_S signal; and P2 is the voltage difference between INV_S signal to LAT_S signal of ON cell. The Tsen time can be reduce based on the P1 and P2 values, where the P1 and P2 values can be decided based on an over drive voltage of the latch transistors (M9 1245, M10 1246, M11 1243, M12 1244, M13 1241, M14 1242).

At time T5, the LAT_S and INV_S signals are at their expected voltage. The BLC signal voltage discharges to VSS (e.g., 0V) to stop further discharging of the LAT_S node, and CLKSA signal has its DCLKSA value. At T6 time, the BLC_NEW signal discharges to VSS, and the INV_S and LAT_S signals are at values for use in the strobe phase.

FIG. 21 illustrates the current in the sense amplifier of FIG. 12 during the strobe phase, with FIG. 22 showing the corresponding waveforms. After completion of sensing phase, the sensed data (i.e., the LAT_S node voltage) is stored into the latch. To do so, at T7 the SLI and SLL signals go to the low VSS voltage so that M11 1243 and M12 1244 transistor will turn ON. Based on the LAT_S signal value (OFF cell or ON cell case), the M13 1241 and M14 1242 transistors are either turned ON or turned OFF. The CN signal value rises at T8, turning on M8 1239 and causing current to flow in the legs of the latch section. As M8 1239 begins to turn on just before T9, the levels on INV_S and then LAT_S begin to move based on whether the selected memory cell is in an ON or OFF state. The strobe interval runs for a time Tstrobe from T9 to T10 while CN is high.

If the selected memory cell is OFF, then the LAT_S node will not discharge and LAT_S will remain at the high VLSA voltage. Consequently, the PMOS M13 1241 will be OFF and NMOS M9 1245 will be ON, so that that INV_S node will discharge to the low supply level VSS if the CN signal is at the high VLSA voltage. As soon as the INV_S signal is at VSS, the PMOS M14 1242 will be ON and M10 1246 will be OFF, so that the LAT_S node will connect to the VLSA voltage. These connections and flows are represented by the solid arrows of FIG. 21. Consequently, if the selected memory is in OFF state, this corresponds to the LAT_S node at the VLSA voltage and the INV_S node at the VSS voltage.

If the selected memory cell is ON, then the LAT_S node will discharge to VSS. In this case PMOS M15 1241 will be ON and NMOS M9 1245 will be OFF, so that the INV_S node will not discharge to VSS and instead charge to the VLSA voltage, even the though CN signal is at the VLSA voltage. As soon as the INV_S signal is at VLSA voltage, the PMOS M14 1242 will be OFF, the NMOS M10 1246 will be ON, and the LAT_S node will discharge to the VSS voltage. This is represented by the broken lines in FIG. 21. Consequently, if the selected memory cell is in an ON state, this will correspond to the LAT_S node at the VSS voltage and the INV_S node at the VLSA voltage.

Once the INV_S and LAT_S values are established, the CLKSA can be taken back high. At T10, CN is lowered, and at T11, SLI and SLL can be taken back to VLSA to set the INV_S and LAT_S values. The latched data value can then be transferred off to the data bus DBUS through M6 1225 or M7 1227, depending on the embodiment.

FIG. 23 illustrates the control signals from T0 through T12, combining the control signals of FIGS. 18, 20, and 22 for completeness, where the control signals can be supplied by the control circuits 1250 of FIG. 12. After T12, the data value for the selected memory cell is set in the latch and ready to be transferred, with the other bias levels on the sense amplifier ready the next read or verify operation. Referring back to FIGS. 1A and 12, the various control signals shown in FIG. 23 for the sense amplifier of FIG. 12 can be generated by the control circuits of the control/bias block 1250. This block can include control circuits within the sense blocks SB1, SB2, . . . , SBp 150, where the sense amplifiers can be located, along with the elements of the on-die control circuitry 110 (including the state machine, on-chip address decoder 114, and power control 116), along with the row decoder 124, column decoder 132, and other elements of read/write circuits 128. For example, the various voltage levels illustrated in FIG. 23 can be provided by power control 116 to logic and decoding circuitry in the sense blocks SB1, SB2, . . . , SBp 150 based on instructions from the state machine 112.

FIG. 24 is a more detailed flowchart of one embodiment for the operation of sense amplifier architecture of FIG. 12 based on FIGS. 17-23. The flow of FIG. 24 provides more detail on the pre-charge phase at step 2400, the sense phase at step 2420, and the strobe phase as step 2440.

Within the pre-charge phase 2400, step 2401 allows the control signals with the sense amplifier to settle and corresponds to the period between T1 and T2 in FIG. 18 or 23. This can also be an idle period before receiving a read command. At step 2403, the pre-charge transistors' control signals PCn go low, turning on M15 1235 and M16 1237 and connecting INV_S and LAT_S to the VLSA level. At step 2405, the signals BLC and BLC_NEW both go high, turning on the switches M3 1216 and M1 1211. This allows the internal bit line node BLI to also be connected to VLSA through LAT_S. In the embodiment illustrated in FIGS. 18 and 23, steps 2403 and 2405 are performed concurrently between T1 and T2. With the biasing of the sense amplifier at the end of T2, INV_S/C1 1231, LAT_S/C2 1233 and BLI will pre-charge from VLSA between T2 and T3 at step 2407. At step 2409, PCn goes high to turn off M15 1235 and M16 1237 to end the pre-charging.

The sense phase of 2420 follows between times T4-T7 as illustrated in FIGS. 20 and 23, starting at step 2421 with lowering the CLKSA level on the lower plate of C1 1231, which lowers the level on INV_S/C1 1231 between T4 and T5. Also, between T4 and T5, at step 2423, LAT_S/C2 1233 will either discharge (if the selected memory cell is ON) or stay high (if the selected memory cell is OFF). Although not included in the flow of FIG. 24, which is just looking at the signals within the sense amplifier, prior to step 2423 the bit line select switch BLS 1213 of FIG. 12 will be on and the selected memory cell 1201 and other array elements (e.g., non-selected bit lines in a NAND) are biased for reading as described above with FIG. 8, for example. After the sense phase interval Tsen ends at T5, at 2425 BLC and BLC_NEW go low to turn off the switches M3 1216 and M1 1211 and end any discharging of LAT_S. In the embodiment illustrated in FIGS. 20 and 23, BLC and BLC_NEW are lowered sequentially at times T5 and T6.

The strobe phase of 2440 that follows at T7 and which is illustrated in FIGS. 22 and 23, starts at step 2441 with the enabling of the latch structure by taking SLL and SLI low between T7 and T8, to turn on M11 1243 and M12 1244, and raising CN between T8 and T9, to turn on M8 1239. At step 2443, during the strobe time Tstrobe between T9 and T10, LAT_S and INV_S are respectively high and low for a selected memory cell being OFF and are respectively low and high for a selected memory cell being ON. At step 2445, the latch elements are disabled by taking CN low (at time T10) to turn off M8 1239 and also by taking SLL and SLI high between T11 and T12 to turn off M11 1243 and M12 1244, where CLKSA is also raised during the strobe interval. After T12, 2447 the data value stored in the latch can be transferred out to the data bus DBUS as convenient.

According to a first set of aspects, a sense amplifier circuit includes a first capacitor, a second capacitor, a latch connected to the first capacitor and to the second capacitor, and one or more control circuits. The one or more control circuits are configured to: pre-charge the first capacitor and the second capacitor; subsequent to pre-charging the first capacitor discharge for a sensing interval the first capacitor through a selected memory cell at a rate based on a conductivity of the selected memory cell; and set a value of the latch based on relative voltage levels of the first capacitor and the second capacitor subsequent to the sensing interval.

Other aspects include a method that includes pre-charging a first capacitor of a sense amplifier and pre-charging a second capacitor of the sense amplifier. A selected memory cell is biased to conduct current at a level dependent on a data state stored in the selected memory cell. After pre-charging the first capacitor, the first capacitor is discharged for a sensing interval through the selected memory cell at a rate based on a conductivity of the biased selected memory cell. Subsequent to the sensing interval, a value of a latch of the sense amplifier is set based on relative voltage levels of the first capacitor and the second capacitor.

Yet more aspects include a non-volatile memory circuit comprising: a plurality of memory cells; a first bit line connected to one or more of the memory cells; a sense amplifier connectable to the first bit line; and one or more control circuits connected to the memory cells and to the sense amplifier. The sense amplifier includes a first capacitor, a second capacitor, and a latch connected to the first capacitor and to the second capacitor. The one or more control circuits are configured to: bias a selected one of the memory cells to conduct current at a level dependent on a data state stored in the selected memory cell; bias the sense amplifier to pre-charge the first capacitor and the second capacitor; subsequently discharge for a sensing interval the first capacitor through the selected memory cell at a rate based on a conductivity of the selected memory cell; and set a value of the latch based on relative voltage levels of the first capacitor and the second capacitor subsequent to the sensing interval.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A sense amplifier circuit, comprising:
a first capacitor;
a second capacitor;
a latch connected to the first capacitor and to the second capacitor; and
one or more control circuits configured to:
   pre-charge the first capacitor and the second capacitor;
   subsequent to the pre-charging the first capacitor, discharge for a sensing interval the first capacitor through a selected memory cell at a rate based on a conductivity of the selected memory cell; and
   set a value of the latch based on relative voltage levels of the first capacitor and the second capacitor subsequent to the sensing interval.

2. The sense amplifier circuit of claim 1, further comprising:
a first pre-charge switch connected between a first plate of the first capacitor and a supply voltage level; and
a second pre-charge switch connected between a first plate of the second capacitor and the supply voltage level, wherein the one or more control circuits are further configured to pre-charge the first capacitor through the first pre-charge switch and pre-charge the second capacitor through the second pre-charge switch.

3. The sense amplifier circuit of claim 2, wherein the one or more control circuits are further configured to:
subsequent to pre-charging the second capacitor and prior to setting the value of the latch, change a voltage level on a second plate of the second capacitor from a first voltage level to a second voltage level, the second voltage level being lower than the first voltage level.

4. The sense amplifier circuit of claim 1, further comprising:
a bit line select switch, whereby the first capacitor is selectively connectable to a plurality of bit lines including a bit line to which the selected memory cell is connected.

5. The sense amplifier circuit of claim 4, wherein the one or more control circuits are further configured to:
prior to discharging the first capacitor, pre-charge the bit line to which the selected memory cell is connected.

6. The sense amplifier circuit of claim 5, wherein the one or more control circuits are further configured to:
subsequent to pre-charging the bit line to which the selected memory cell is connected and prior to discharging the first capacitor, stabilize a voltage level on the bit line to which the selected memory cell is connected.

7. The sense amplifier circuit of claim 1, further comprising:
a transfer switch connected to the latch, whereby the one or more control circuits are configured to transfer the value of the latch to a data bus.

8. A method, comprising:
pre-charging a first capacitor of a sense amplifier;
pre-charging a second capacitor of the sense amplifier;
biasing a selected memory cell to conduct current at a level dependent on a data state stored in the selected memory cell;
subsequent to pre-charging the first capacitor, discharging for a sensing interval the first capacitor through the selected memory cell at a rate based on a conductivity of the biased selected memory cell; and
subsequent to the sensing interval, setting a value of a latch of the sense amplifier based on relative voltage levels of the first capacitor and the second capacitor.

9. The method of claim 8, wherein the selected memory cell is configured to store one of a plurality of data states and biasing the selected memory cell includes:
applying to the selected memory cell a sensing voltage at which the selected memory cell will be conductive for one or more, but less than all, or the plurality of data states.

10. The method of claim 8, wherein:
pre-charging the first capacitor includes pre-charging a first plate of the first capacitor from a high voltage supply level; and
pre-charging the second capacitor includes pre-charging a first plate of the second capacitor from the high voltage supply level.

11. The method of claim 10, further comprising:
subsequent to pre-charging the second capacitor and prior to setting the value of the latch, lowing a voltage level on a second plate of the second capacitor from a first voltage level to a second, lower voltage level.

12. The method of claim 8, wherein the selected memory cell is one of a plurality of memory cells each connected to a corresponding bit line, each of the bit lines selectively connectable to the first capacitor, the method further comprising:
prior to discharging the first capacitor through the selected memory cell, connecting the first capacitor to the bit line corresponding to the selected memory cell.

13. The method of claim 12, further comprising:
prior to connecting the first capacitor to the bit line corresponding to the selected memory cell, pre-charging the bit line corresponding to the selected memory cell.

14. The method of claim 13, further comprising:
subsequent to pre-charging the bit line to which the selected memory cell is connected and prior to discharging the first capacitor, stabilizing a voltage level on the bit line to which the selected memory cell is connected.

15. The method of claim 8, further comprising:
subsequent to setting a value of the latch, transferring the value of the latch to a data bus.

16. A non-volatile memory circuit, comprising:
a plurality of non-volatile memory cells;
a first bit line connected to one or more of the memory cells;
a sense amplifier connectable to the first bit line, the sense amplifier comprising a first capacitor, a second capacitor, and a latch connected to the first capacitor and to the second capacitor; and
one or more control circuits connected to the memory cells and to the sense amplifier and configured to:
bias a selected one of the memory cells to conduct current at a level dependent on a data state stored in the selected memory cell,
bias the sense amplifier to pre-charge the first capacitor and the second capacitor,
subsequent to pre-charging the first capacitor, discharge for a sensing interval the first capacitor through the selected memory cell at a rate based on a conductivity of the selected memory cell, and
set a value of the latch based on relative voltage levels of the first capacitor and the second capacitor subsequent to the sensing interval.

17. The non-volatile memory circuit of claim 16, wherein the one or more control circuits are configured to pre-charge the first capacitor by connecting a first plate of the first capacitor to a supply voltage level and to pre-charge the second capacitor by connecting a first plate of the second capacitor to the supply voltage level, the one or more control circuits further configured to:
subsequent to pre-charging the second capacitor and prior to setting the value of the latch, change a voltage level on a second plate of the second capacitor from a first voltage level to a second voltage level, the second voltage level being lower than the first voltage level.

18. The non-volatile memory circuit of claim 16, wherein the non-volatile memory circuit further includes:
a plurality of bit lines including the first bit line, the sense amplifier further includes a bit line select switch whereby the first capacitor is selectively connectable to the plurality of bit lines including the first bit line, the one or more control circuits are further configured to connect the first capacitor to the first bit line by the bit line select switch prior to discharging the first capacitor.

19. The non-volatile memory circuit of claim 18, wherein the one or more control circuits are further configured to:
prior to discharging the first capacitor, pre-charge the first bit line.

20. The non-volatile memory circuit of claim 19, wherein the one or more control circuits are further configured to:
subsequent to pre-charging the first bit line and prior to discharging the first capacitor, stabilize a voltage level on the bit line to which the selected memory cell is connected.

* * * * *